US012695452B2

(12) United States Patent
Choi et al.

(10) Patent No.: US 12,695,452 B2
(45) Date of Patent: Jul. 28, 2026

(54) MEMORY DEVICE, INTEGRATED CIRCUIT DEVICE, AND OPERATION METHOD OF INTEGRATED CIRCUIT DEVICE

(71) Applicant: Samsung Electronics Co., Ltd., Suwon-si (KR)

(72) Inventors: Moon-Chul Choi, Suwon-si (KR); Sung-Yong Cho, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 7 days.

(21) Appl. No.: 18/792,735

(22) Filed: Aug. 2, 2024

(65) Prior Publication Data
US 2025/0055459 A1 Feb. 13, 2025

(30) Foreign Application Priority Data
Aug. 10, 2023 (KR) ........................ 10-2023-0105098

(51) Int. Cl.
*H03K 19/00* (2006.01)
*G11C 7/10* (2006.01)
*H04L 25/03* (2006.01)

(52) U.S. Cl.
CPC ....... *H03K 19/0005* (2013.01); *G11C 7/1048* (2013.01); *G11C 7/1051* (2013.01); *H04L 25/03891* (2013.01)

(58) Field of Classification Search
CPC ......... H03K 19/00369; H03K 19/0005; H03K 19/0175; H03K 19/017545; H03K 19/0185; H03K 19/018557; H03K 17/14; G11C 7/10; G11C 7/1048; G11C 7/1051; G11C 7/1057
See application file for complete search history.

(56) References Cited

U.S. PATENT DOCUMENTS

| | | | |
|---|---|---|---|
| 6,690,191 B2 | 2/2004 | Wu et al. | |
| 6,924,660 B2 | 8/2005 | Nguyen et al. | |
| 7,215,144 B2 * | 5/2007 | Mitby ................. | H04L 25/0288 |
| | | | 326/82 |
| 8,390,317 B2 | 3/2013 | Bae et al. | |
| 9,048,824 B2 | 6/2015 | Chan et al. | |
| 9,698,778 B2 | 7/2017 | Huang | |
| 9,948,300 B1 * | 4/2018 | Greeff .............. | H03K 19/00323 |
| 10,270,450 B1 | 4/2019 | Ma et al. | |
| 11,031,054 B1 * | 6/2021 | Arai ...................... | G11C 29/022 |
| 11,342,907 B2 * | 5/2022 | Seok ...................... | H03K 5/151 |
| 12,526,172 B2 * | 1/2026 | Kong .................... | H04L 25/026 |
| 2014/0159769 A1 * | 6/2014 | Hong ................... | G11C 7/1051 |
| | | | 326/30 |
| 2017/0134191 A1 | 5/2017 | Rahman et al. | |

(Continued)

*Primary Examiner* — Jason M Crawford
(74) *Attorney, Agent, or Firm* — Muir Patent Law, PLLC

(57) ABSTRACT
An integrated circuit device may include a transmission driver and an equalizer. The transmission driver may be configured to, in response to a transmission control data, transmit an output signal to an outside through a signal line in a transmission operation that outputs the output signal to the outside, and provide termination resistance in a reception operation that receives an input signal from the outside through the signal line. The equalizer may be configured to, in response to an equalizer control data, amplify high-frequency components of the output signal in the transmission operation, and to provide termination resistance in the reception operation.

16 Claims, 17 Drawing Sheets

(56)     References Cited

U.S. PATENT DOCUMENTS

2019/0379357 A1*  12/2019  Kang  ................ H04L 25/03019
2022/0076715 A1*   3/2022  Lee  ...................... G11C 7/1051
2024/0241647 A1*   7/2024  Shih  ...................... G06F 3/0653
2024/0361919 A1*  10/2024  Shih  ...................... G06F 3/0673
2024/0386921 A1*  11/2024  Park  .................. H03K 19/0005
2025/0055459 A1*   2/2025  Choi  ................... G11C 7/1051
2025/0240191 A1*   7/2025  Ryu  ................... H04L 25/0264
2025/0267044 A1*   8/2025  Kong  ............ H03K 19/018585

* cited by examiner

| SEL | CODE1 | CODE2 |
|-----|-------|-------|
| 0 [TX] | EC1 [EMP] | TC1 [OCD] |
| 1 [RX] | EC2 [ODT] | TC2 [ODT] |

FIG.  12A

| SEL | CODE1 | CODE2 |
|---|---|---|
| 0 [TX] | EC3 [OCD] | TC1 [OCD] |
| 1 [RX] | EC2 [ODT] | TC2 [ODT] |

FIG. 12B

| SEL | CODE1 | CODE2 |
|------|--------|--------|
| 0 [TX1] | EC1 [EMP] | TC1 [OCD] |
| 1 [TX2] | EC3 [OCD] | TC1 [OCD] |
| 2 [RX] | EC2 [ODT] | TC2 [ODT] |

MEMORY DEVICE, INTEGRATED CIRCUIT DEVICE, AND OPERATION METHOD OF INTEGRATED CIRCUIT DEVICE

CROSS-REFERENCE TO RELATED APPLICATION(S)

This application claims priority under 35 U.S.C. § 119 to Korean Patent Application No. 10-2023-0105098, filed on Aug. 10, 2023 in the Korean Intellectual Property office, the disclosure of which is incorporated by reference herein in its entirety.

BACKGROUND

The inventive concept relates to a semiconductor memory, and more particularly, to a memory device, an integrated circuit device, and an operating method of the integrated circuit device.

Semiconductor memories may be classified into volatile memory devices, such as static random access memory (RAM) (SRAM) and dynamic RAM (DRAM), and non-volatile memory devices, which maintain stored data even when power supply thereto is cut off, such as phase change RAM (PRAM), magnetic RAM (MRAM), resistive RAM (RRAM), and ferro-electric RAM (FRAM).

Generally, DRAM devices communicate with memory controllers or hosts by using a high-speed interface such as a double data rate (DDR) interface. In this time, as impedance matching of the signal line or data line is not achieved, the signal provided via the signal line or data line is reflected, and as a result, there is an issue of reduction in signal quality.

SUMMARY

The inventive concept provides a memory device having an area and parasitic capacitance of the memory device reduced, an integrated circuit device, and an operating method of the integrated circuit device.

According to an aspect of the inventive concept, an integrated circuit device may include a transmission driver and an equalizer. The transmission driver may be configured to, in response to a transmission control data, transmit an output signal to an outside through a signal line in a transmission operation that outputs the output signal to the outside, and provide termination resistance in a reception operation that receives an input signal from the outside through the signal line. The equalizer may be configured to, in response to an equalizer control data, amplify high-frequency components of the output signal in the transmission operation, and provide termination resistance in the reception operation.

According to another aspect of the inventive concept, a memory device may include a memory cell array, a data line driver, and an equalizer control circuit. The memory cell array may include a plurality of memory cells configured to store data. The data line driver may be configured to transmit the data to an external device via a data line in a data transmission operation, and provide termination resistance in a data reception operation. The equalizer may be configured to, in response to an equalizer control data, perform a pre-emphasis operation in the data transmission operation, and perform an on die termination (ODT) operation in the data reception operation. The equalizer control circuit may be configured to provide the equalizer control data to the equalizer.

According to another aspect of the inventive concept, an operation method of an integrated circuit device including an equalizer control circuit, a transmission driver, and an equalizer may include receiving, by the equalizer control circuit, a data and a selection signal indicating a reception operation of the integrated circuit device, selecting, by the equalizer control circuit, as a first code, a second EQ code among a first EQ code corresponding to a pre-emphasis operation and the second EQ code corresponding to an on die termination (ODT) operation, in response to the selection signal indicating the reception operation, generating an equalizer control data, by the equalizer control circuit, by encoding based on the first code and the received data, outputting the generated equalizer control data to the equalizer, and providing termination resistance, by the equalizer, based on the equalizer control data.

BRIEF DESCRIPTION OF THE DRAWINGS

Embodiments will be more clearly understood from the following detailed description taken in conjunction with the accompanying drawings in which:

FIG. 1 is a schematic block diagram of an electronic system according to an embodiment;

FIGS. 2A and 2B are diagrams describing an operation of an electronic system according to example embodiments;

FIG. 5 is a diagram for describing a first code and a second code according to example embodiments;

FIGS. 12A and 12B are tables for describing a first code and a second code according to example embodiments;

DETAILED DESCRIPTION OF THE EMBODIMENTS

Figure 3:
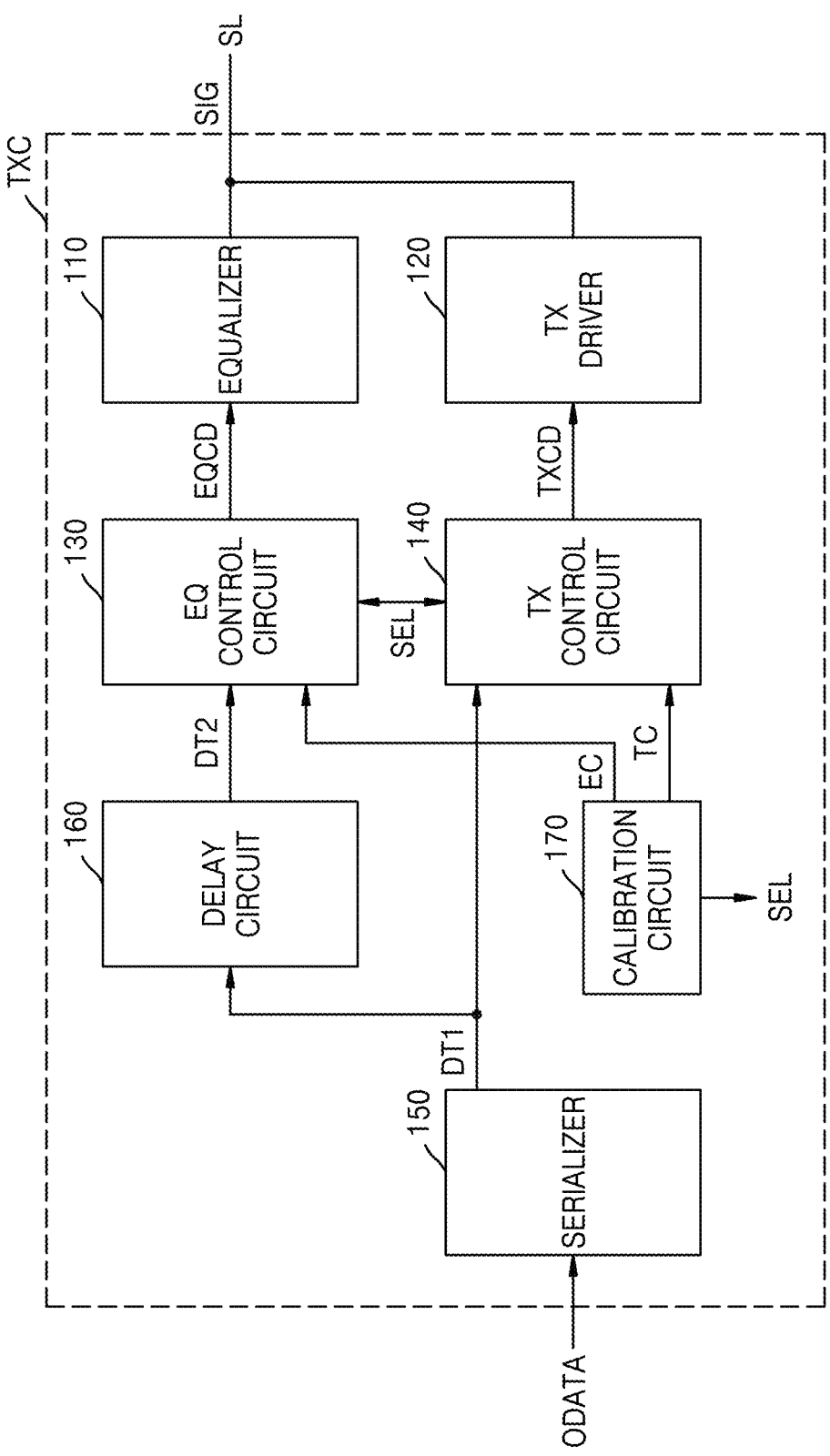
FIG. 3 is a block diagram of a transmission circuit according to an embodiment.

Hereinafter, embodiments of the inventive concept are described clearly and in detail so that one of ordinary skill in the art easily implements the inventive concept.

Terms performing particular functions or including particular functions, such as "block," "unit," "module," "driver," and "circuit", as described below or illustrated in diagrams may be implemented as types of software, hardware, or a combination thereof.

Figure 1:
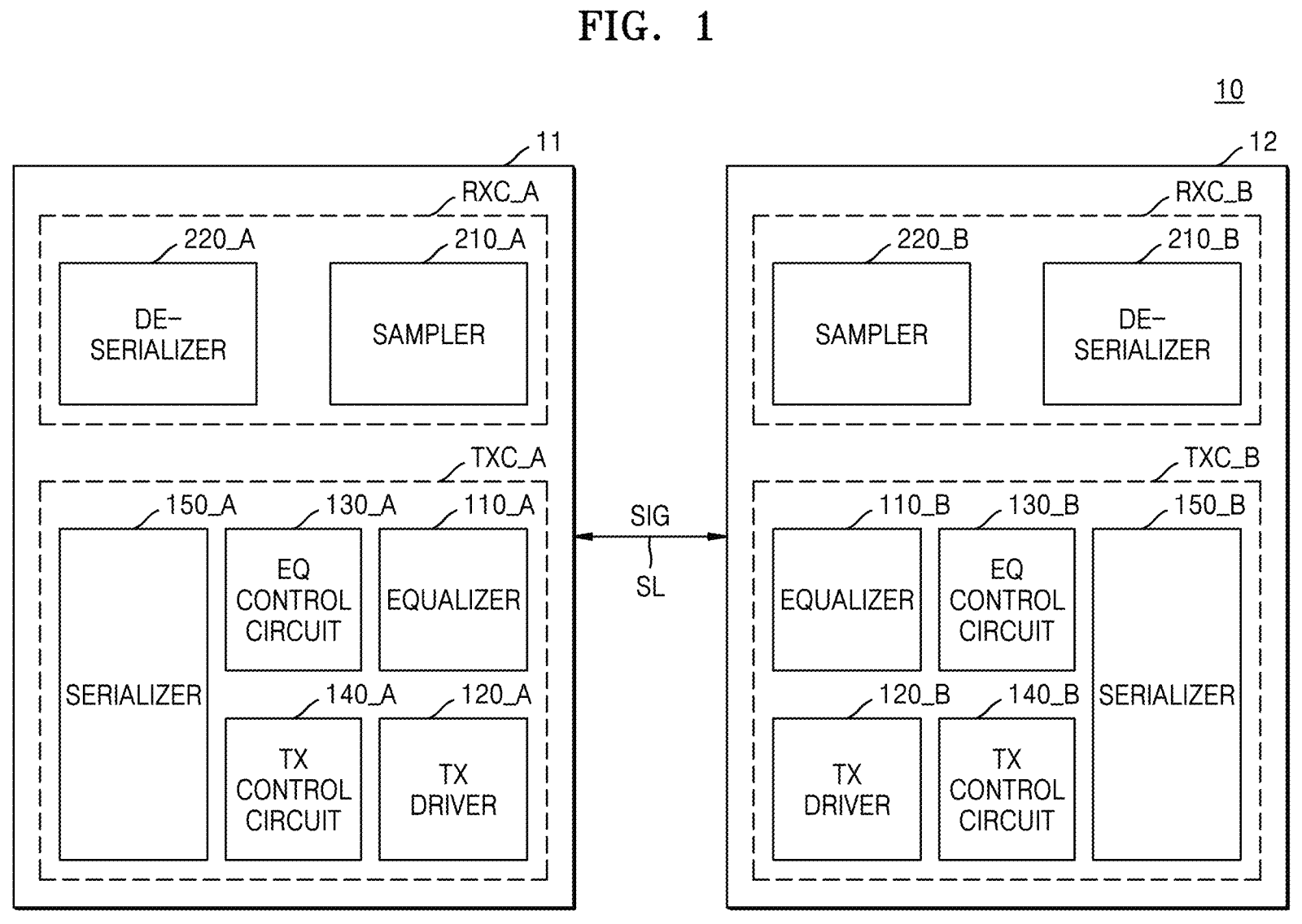

FIG. 1 is a schematic block diagram of an electronic system 10 according to an embodiment.

Referring to FIG. 1, the electronic system 10 may include a first integrated circuit device 11 and a second integrated circuit device 12. In an embodiment, each of the first and second integrated circuit devices 11 and 12 may include a computing device, such as a portable communication terminal, a personal digital assistant (PDA), a portable media player (PMP), a smartphone, a wearable device, a personal computer, a server, a workstation, and a notebook. Alternatively or additionally, the first and second integrated circuit devices 11 and 12 may include various hardware components included in one user device, for example, a processor, a memory device, a storage device, or a control device.

The first and second integrated circuit devices 11 and 12 may transmit and receive a signal SIG with each other via a signal line SL for communication. The first integrated circuit devices 11 includes a transmission circuit TXC_A and a reception circuit RXC_A. The second integrated circuit devices 12 may include a transmission circuit TXC_B and a reception circuit RXC_B.

The transmission circuit TXC_A of the first integrated circuit device 11 may transmit information generated by the first integrated circuit device 11 as the signal SIG (or an output signal SIG) to the second integrated circuit device 12 via the signal line SL. The reception circuit RXC_B of the second integrated circuit device 12 may receive the signal SIG (or an input signal SIG) transmitted from the transmission circuit TXC_A of the first integrated circuit device 11 via the signal line SL. Similarly as described above, the transmission circuit TXC_B of the second integrated circuit device 12 may transmit the signal SIG to the first integrated circuit device 11 via the signal line SL, and the reception circuit RXC_A of the first integrated circuit device 11 may receive the signal SIG via the signal line SL. In other words, the electronic system 10 may include a bidirectional link system transmitting bidirectional data via one signal line SL or one channel.

In an embodiment, the signal line SL may include a signal line (that is, a wired communication channel) electrically connecting between the first integrated circuit device 11 and the second integrated circuit device 12. In other words, each of the transmission circuit TXC_A, TXC_B and the reception circuit RXC_A, RXC_B may transceive various types of signals, such as an electrical signal and an optical signal. Hereinafter, for convenience of descriptions, each of the transmission circuit TXC_A, TXC_B and the reception circuit RXC_A, RXC_B is assumed to operate based on an electrical signal.

In an embodiment, the transmission circuit TXC_A and the reception circuit RXC_A are separately illustrated in the first integrated circuit device 11, and the reception circuit RXC_B and the transmission circuit TXC_B are separately illustrated in the second integrated circuit device 12, but the transmission circuit TXC_A and the reception circuit RXC_A may be implemented as one transmission/reception circuit in the first integrated circuit device 11 and the transmission circuit TXC_B and the reception circuit RXC_B may be implemented as one transmission/reception circuit in the second integrated circuit device 12.

However, when the signal SIG is transmitted via the signal line SL, the signal SIG may be distorted due to reflective characteristics of the signal line SL or due to noise caused by external factors. As such, information transmitted by the transmission circuit TXC_A, TXC_B and information received by the reception circuit RXC_A, RXC_B may be different from each other. In other words, information to be transmitted by the first integrated circuit device 11 and information received by the second integrated circuit device 12 may be different from each other, and as a result, an error or a malfunction may occur in the second integrated circuit device 12.

To prevent the error or malfunction described above, the transmission circuit TXC_A, TXC_B or the reception circuit RXC_A, RXC_B may include components and/or functions for correcting signal distortion caused by reflective characteristics or noise due to external factors. For example, the transmission circuit TXC_A, TXC_B may include an equalizer configured to correct the signal distortion due to the reflective characteristics of the signal line SL, and the reception circuit RXC_A, RXC_B may include an equalizer (not illustrated) configured to correct the signal distortion due to the response characteristics of the signal line SL.

Hereinafter, it is assumed that the first integrated circuit device 11 transmits the signal SIG to the second integrated circuit device 12. In other words, the first integrated circuit device 11 may be a transmission end, and the second integrated circuit device 12 may be a reception end.

The reception circuit RXC_A may include a de-serializer 220_A (or a de-serializer circuit) and a sampler 210_A (or a sampler circuit). The reception circuit RXC_B may include a de-serializer 220_B (or a de-serializer circuit) and a sampler 210_B (or a sampler circuit). The sampler 210_A, 210_B may sample the signal SIG based on a clock signal. For example, the sampler 210_A, 210_B may sample logic values of the signal SIG at a rising edge or a falling edge of the clock signal. The sampler 210_A, 210_B may include a flip-flop which latches, holds, and stores the logic values of the signal SIG at the rising edge or the falling edge of the clock signal. The de-serializer 220_A, 220_B may parallelize the sampled logic values to generate data.

The transmission circuit TXC_A may include an equalizer 110_A (or a transmission equalizer), a transmission (TX) driver 120_A, an equalizer control circuit 130_A (hereinafter, referred to as an 'EQ control circuit'), a transmission (TX) control circuit 140_A and a serializer 150_A. The transmission circuit TXC_B may include an equalizer 110_B (or a transmission equalizer), a transmission (TX) driver 120_B, an equalizer control circuit 130_B (hereinafter, referred to as an 'EQ control circuit'), a transmission (TX) control circuit 140_B, and a serializer 150_B.

The equalizers 110_A and 110_B may, to reduce inter-symbol interference (ISI) on a signal line during signal transmission, decrease low frequency gain and increase high frequency gain. When the signal SIG is transmitted at a high speed via the signal line SL, the bandwidth of a channel may be limited and a high frequency component of a signal may be reduced due to a load on the signal line SL, a skin effect, a dielectric loss, ISI, or the like. The equalizer 110_A, 110_B may be used for correcting a channel loss in a bidirectional link system. The equalizer 110_A, 110_B may amplify the high frequency component of a signal that is output. Alternatively or additionally, the equalizer 110_A, 110_B may boost or strengthen the high frequency component of the signal. For example, the equalizer 110_A, 110_B may include a feed forward equalizer (FFE).

The equalizer 110_A, 110_B may amplify the high frequency component of the signal SIG in a transmission operation of outputting the signal SIG to the outside (e.g., to an external device). The equalizer 110_A at the transmission end (that is, the equalizer 110_A of the first integrated circuit device 11) may be used as a pre-emphasis circuit (or a de-emphasis circuit). The equalizer 110_A may operate as a pre-emphasis circuit during a data transmission operation. The equalizer 110_A may perform a pre-emphasis operation (hereinafter, referred to as an 'EMP operation') (or a de-emphasis operation). For example, the EMP operation may be referred to as an operation of amplifying the high frequency component of the signal SIG. Herein, for convenience of description, the terms of the transmission operation and the data transmission operation may be used interchangeably.

The equalizer 110_A, 110_B may provide termination resistance in a reception operation of receiving the signal SIG from the outside. The equalizer 110_B at the reception end (that is, the equalizer 110_B of the second integrated circuit device 12) may be used as an on die termination (ODT) circuit, and the equalizer 110_B may operate as the ODT circuit during a data reception operation. The equalizer 110_B may perform the ODT operation. For example, the ODT operation may be referred to as an operation of providing the termination resistance. Herein, for convenience of description, the terms of the reception operation and the data reception operation may be used interchangeably.

The TX driver 120_A, 120_B may be configured to control or drive the signal line SL. The TX driver 120_A, 120_B may transmit or output the signal SIG to an external device via the signal line SL. The TX driver 120_A, 120_B may control impedance of the signal line SL so that the impedance matching is obtained with respect to the signal line SL.

The TX driver 120_A, 120_B may drive the signal line SL to transmit the signal SIG to the outside in a transmission operation of outputting the signal SIG to the outside. The TX driver 120_A at the transmission end (that is, the TX driver 120_A of the first integrated circuit device 11) may be used as an off chip driver (OCD) circuit. The TX driver 120_A may operate as the OCD circuit. The TX driver 120_A may perform an OCD operation. For example, the OCD operation may be referred to as an operation of driving the signal line SL and transmitting or outputting data to the outside.

The TX driver 120_A, 120_B may provide termination resistance in a reception operation of receiving the signal SIG from the outside. The TX driver 120_B at the reception end (that is, the TX driver 120_B of the second integrated circuit device 12) may be used as an ODT circuit. The TX driver 120_B may operate as the ODT circuit at the data reception operation. The TX driver 120_B may perform the ODT operation. For example, the ODT operation may be referred to as an operation of providing the termination resistance.

The EQ control circuit 130_A may control the equalizer 110_A. The EQ control circuit 130_B may control the equalizer 110_B. The EQ control circuit 130_A, 130_B may control the equalizer 110_A, 110_B to be activated or deactivated. The EQ control circuit 130_A, 130_B may control the equalizer 110_A, 110_B to be turned on or turned off. The EQ control circuit 130_A, 130_B may control the equalizer 110_A, 110_B to operate as a pre-emphasis circuit or as an ODT circuit. The EQ control circuit 130_A, 130_B may control the equalizer 110_A, 110_B to perform the EMP operation or the ODT operation. The EQ control circuit 130_A, 130_B may control the equalizer 110_A, 110_B to perform the EMP operation in a transmission operation. The EQ control circuit 130_A, 130_B may control the equalizer 110_A, 110_B to perform the ODT operation in a reception operation.

In an embodiment, the EQ control circuit 130_A, 130_B may generate an equalizer control data (hereinafter, referred to as 'an EQ control data'), and output the EQ control data to the equalizer 110_A, 110_B. The TX control circuit 140_A may control the TX driver 120_A. The TX control circuit 140_B may control the TX driver 120_B. The TX control circuit 140_A, 140_B may generate a transmission control data, and output the transmission control data to the TX driver 120_A, 120_B. The serializer 150_A, 150_B may serialize data to generate the signal SIG.

As described above, the equalizer 110_A, 110_B according to an embodiment may operate as the ODT circuit in a reception operation. In other words, the equalizer 110_B of the second integrated circuit device 12 may be activated in a reception operation, and provide termination resistance. The first integrated circuit devices 11 may increase the ODT range by using both the TX driver 120_A and the equalizer 110_A as the ODTs. The second integrated circuit devices 12 may increase the ODT range by using both the TX driver 120_B and the equalizer 110_B as the ODTs. For example, the ODT circuit may be configured to have one or more ODT resistance values without increasing an area of the ODT circuit. Accordingly, an integrated circuit device, in which an area of a chip forming the integrated circuit device is reduced and parasitic capacitance is reduced, may be provided. In addition, signal reflection to the signal line SL may be reduced, and the reliability of the signal SIG may be improved. The configuration and operation of the transmission circuit TXC_A, TXC_B described above are described in more detail with reference to the diagrams below.

Figure 2A:
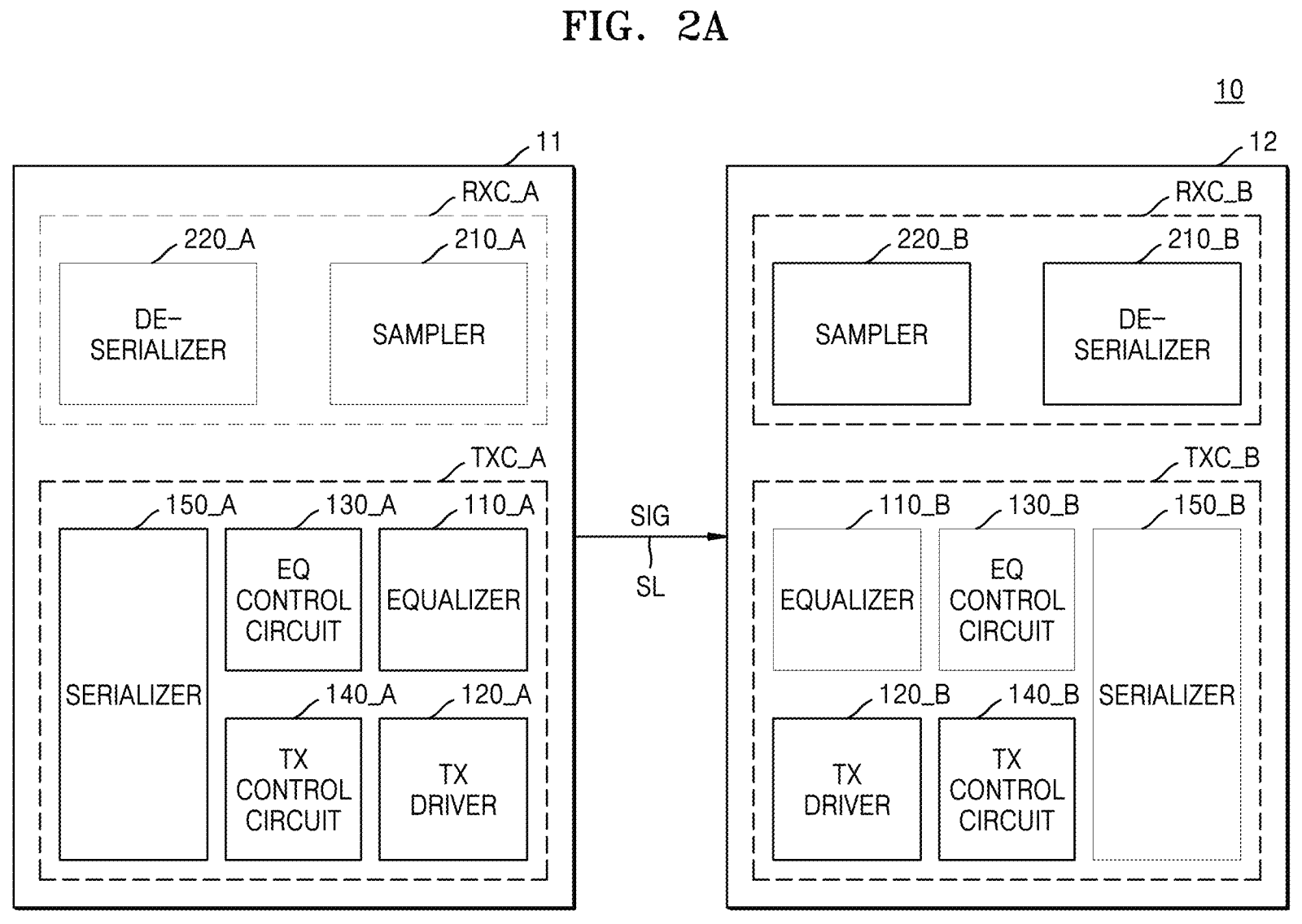
Figure 2B:
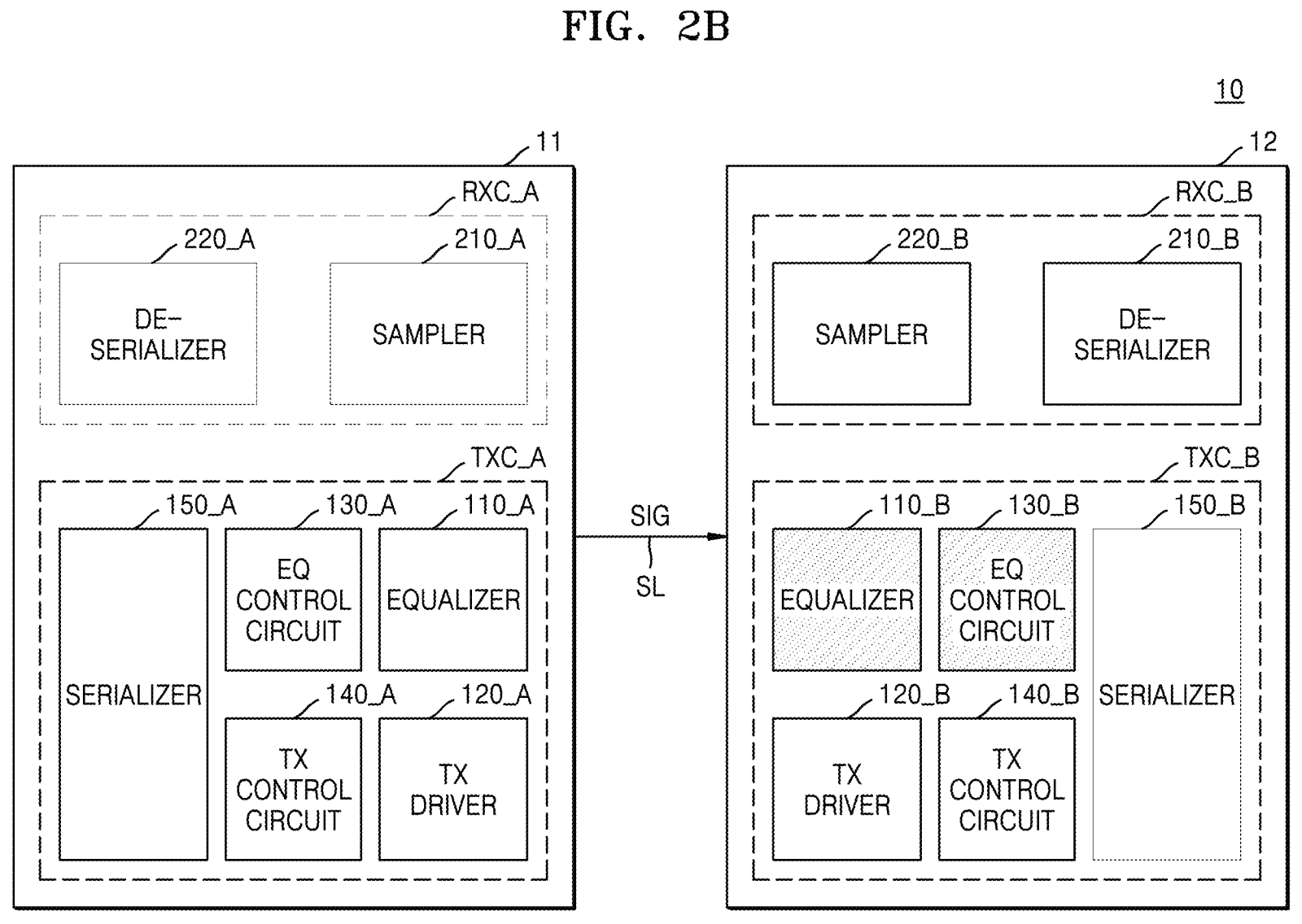

FIGS. 2A and 2B are diagrams describing an operation of the electronic system 10 according to example embodiments.

Referring to FIG. 2A, the equalizer 110_B of the second integrated circuit 12 at the reception end is inactivated. Referring to FIG. 2B, the equalizer 110_B of the second integrated circuit 12 at the reception end is activated. Referring to FIG. 2A, the first integrated circuit device 11 may transmit the signal SIG to the second integrated circuit device 12 via the signal line SL. The first integrated circuit device 11 may serve as a transmission end outputting the signal SIG via the signal line SL. The second integrated circuit device 12 may serve as a reception end receiving the signal SIG via the signal line SL. In other words, the first integrated circuit device 11 may include the transmission end, and the second integrated circuit device 12 may include the reception end. The transmission circuit TXC_A of the first integrated circuit device 11 may generate the signal SIG, and output the signal to the second integrated circuit device 12. In other words, the transmission circuit TXC_A of the first integrated circuit device 11 may be turned on, and the reception circuit RXC_A of the first integrated circuit device 11 may be turned off. In some embodiment, the transmission circuit TXC_A of the first integrated circuit device 11 may be turned off, and the reception circuit RXC_A of the first integrated circuit device 11 may be turned on.

The reception circuit RXC_B of the second integrated circuit device 12 may receive the signal SIG. The reception circuit RXC_B of the second integrated circuit device 12 may be turned on. The TX driver 120_B of the second integrated circuit device 12 may be used as the ODT circuit. The TX driver 120_B of the second integrated circuit device 12 and the TX control circuit 140_B of the second integrated circuit device 12 may be turned on. The equalizer 110_B, the EQ control circuit 130_B, and the serializer 150_B of the second integrated circuit device 12 may be turned off.

Referring to FIG. 2B, the first integrated circuit device 11 may transmit the signal SIG to the second integrated circuit device 12 via the signal line SL. The first integrated circuit device 11 may include the transmission end, and the second integrated circuit device 12 may include the reception end.

The transmission circuit TXC_A of the first integrated circuit device 11 may generate the signal SIG, and output the signal to the second integrated circuit device 12. In other words, the transmission circuit TXC_A of the first integrated circuit device 11 may be turned on, and the reception circuit RXC_A of the first integrated circuit device 11 may be turned off.

The reception circuit RXC_B of the second integrated circuit device 12 may receive the signal SIG. The reception circuit RXC_B of the second integrated circuit device 12 may be turned on. The reception circuit RXC_B of the second integrated circuit device 12 may be activated. The TX driver 120_B of the second integrated circuit device 12 may be used as the ODT circuit. The TX driver 120_B of the second integrated circuit device 12 and the EQ control circuit 130_B of the second integrated circuit device 12 may be turned on. The TX driver 120_B of the second integrated circuit device 12 and the EQ control circuit 130_B of the second integrated circuit device 12 may be activated.

In an embodiment, the equalizer 110_B of the second integrated circuit device 12 may be used as the ODT circuit. When the second integrated circuit device 12 receives the signal SIG from the first integrated circuit device 11, the equalizer 110_B of the second integrated circuit device 12 may provide termination resistance. In the signal reception operation, the equalizer 110_B of the second integrated circuit device 12 and the EQ control circuit 130_B of the second integrated circuit device 12 may be turned on. In some embodiments, in the signal reception operation, the equalizer 110_B of the second integrated circuit device 12 and the EQ control circuit 130_B of the second integrated circuit device 12 may be turned on. The serializer 150_B of the second integrated circuit device 12 may be turned off.

As described above, although the equalizer 110_B of the second integrated circuit device 12 in FIG. 2A may be deactivated, the equalizer 110_B of the second integrated circuit device 12 in FIG. 2B may be activated. As the equalizer 110_B at the reception end provides termination resistance, signal distortion due to reflected waves may be prevented at the reception end. In addition, an integrated circuit device, in which an area thereof is reduced and parasitic capacitance thereof is reduced, may be provided.

FIG. 3 is a block diagram of the transmission circuit TXC according to an embodiment.

Referring to FIGS. 1 and 3, the transmission circuit TXC may include the equalizer 110, the TX driver 120, the EQ control circuit 130, the TX control circuit 140, the serializer 150, a delay circuit 160 and a calibration circuit 170. The transmission circuit TXC of FIG. 3 may correspond to the transmission circuit TXC_A, TXC_B of FIG. 1. The equalizer 110 of FIG. 3 may correspond to the equalizer 110_A, 110_B of FIG. 1. The TX driver 120 of FIG. 3 may correspond to the TX driver 120_A, 120_B of FIG. 1. The EQ control circuit 130 of FIG. 3 may correspond to the EQ control circuit 130_A, 130_B of FIG. 1. The TX control circuit 140 of FIG. 3 may correspond to TX control circuits 140_A, 140_B of FIG. 1. The serializer 150 of FIG. 3 may correspond to the serializers 150_A, 150_B of FIG. 1.

The serializer 150 may serialize data. For example, the serializer 150 may receive an output data ODATA that is output from a plurality of memory cells in parallel. The serializer 150 may serialize the output data ODATA to generate first data DT1. The serializer 150 may output the first data DT1 to the delay circuit 160. The serializer 150 may output the first data DT1 to the TX control circuit 140.

The delay circuit 160 may delay the received first data DT1. For example, the delay circuit 160 may delay the first data DT1 according to a predetermined duration value. The delay circuit 160 may delay the first data DT1 and output second data DT2. The delay circuit 160 may output the second data DT2 to the EQ control circuit 130.

The calibration circuit 170 may perform a calibration operation (or a training operation) for the operation of the first and second integrated circuit devices 11 and 12. The calibration circuit 170 may adjust operation parameters of the first and second integrated circuit devices 11 and 12. The calibration circuit 170 may generate codes (or a code) for controlling the equalizer 110, and provide the code to the EQ control circuit 130. The calibration circuit 170 may generate codes (or a code) for controlling the TX driver 120, and provide the codes to the TX control circuit 140.

The calibration circuit 170 may adjust the amplification intensity of the equalizer 110. The calibration circuit 170 may adjust the degree of amplifying the high frequency component. The calibration circuit 170 may generate and provide codes used for the equalizer 110 to perform the EMP operation. The calibration circuit 170 may generate and provide codes used for the equalizer 110 to perform the ODT operation. The calibration circuit 170 may generate codes for controlling a pull-up driver and a pull-down driver of the equalizer 110. The calibration circuit 170 may provide an EQ code (or an equalizer code) EC to the equalizer control circuit 130. For example, the EQ code EC may include a code for controlling the pull-up driver and the pull-down driver of the equalizer 110.

The calibration circuit 170 may control the impedance of the signal line SL to achieve the impedance matching of the signal line SL. The calibration circuit 170 may generate and provide codes (or a code) used for the TX driver 120 to perform the OCD operation. The calibration circuit 170 may generate and provide codes (or a code) used for the TX driver 120 to perform the ODT operation. The calibration circuit 170 may generate codes for controlling a pull-up driver and a pull-down driver of the TX driver 120. The calibration circuit 170 may provide a TX code (or a transmission code) TC to the TX control circuit 140. For example, the TX code TC may include a code for controlling the pull-up driver and the pull-down driver of the TX driver 120.

In an embodiment, the EQ code EC may include a first EQ code and a second EQ code. For example, the first EQ code may correspond to the EMP operation of the equalizer 110, and the second EQ code may correspond to the ODT operation of the equalizer 110. The TX code TC may include a first TX code and a second TX code. For example, the first TX code may correspond to the OCD operation of the TX driver 120, and the second TX code may correspond to the ODT operation of the TX driver 120.

As described above, the calibration circuit 170 may perform a calibration operation to determine the first EQ code, the second EQ code, the first TX code, and the second TX code. The calibration circuit 170 may provide the first EQ code and the second EQ code to the EQ control circuit 130. The calibration circuit 170 may provide the first TX code and the second TX code to the TX control circuit 140.

The EQ control circuit 130 may receive the second data DT2. The EQ control circuit 130 may receive the EQ code EC. The EQ control circuit 130 may perform encoding based on the second data DT2 and the EQ code EC. The EQ control circuit 130 may encode the second data DT2 and the EQ code EC to generate an EQ control data EQCD. The EQ control circuit 130 may provide the EQ control data EQCD to the equalizer 110.

For example, the EQ control circuit 130 may generate the EQ control data EQCD based on the first EQ code corresponding to the EMP operation in the transmission operation. The EQ control circuit 130 may output the EQ control data EQCD generated during the transmission operation to the equalizer 110. The EQ control circuit 130 may generate the EQ control data EQCD based on the second EQ code corresponding to the ODT operation in the reception operation. The EQ control circuit 130 may output the EQ control data EQCD generated in the reception operation to the equalizer 110.

The TX control circuit 140 may control the TX driver 120. The TX control circuit 140 may control the TX driver 120 whether to operate as the OCD circuit or the ODT circuit. The TX control circuit 140 may control the TX driver 120 to perform the OCD operation or the ODT operation. The TX control circuit 140 may control the TX driver 120 to perform the OCD operation in the transmission operation. The TX control circuit 140 may control the TX driver 120 to perform the ODT operation in the reception operation.

The TX control circuit 140 may receive the first data DT1. The TX control circuit 140 may receive the TX code TC. The TX control circuit 140 may perform encoding based on the first data DT1 and the TX code TC. The TX control circuit 140 may encode based on the first data DT1 and the TX code TC to generate the transmission control data TXCD. The TX control circuit 140 may output the transmission control data TXCD to the TX driver 120.

For example, the TX control circuit 140 may generate the transmission control data TXCD based on the first TX code corresponding to the OCD operation in the transmission operation. The TX control circuit 140 may output the transmission control data TXCD generated in the transmission operation to the TX driver 120. The TX control circuit 140 may generate the transmission control data TXCD based on the second TX code corresponding to the ODT operation in the reception operation. The TX control circuit 140 may output the transmission control data TXCD generated in the reception operation to the TX driver 120.

The equalizer 110 may receive the EQ control data EQCD. The equalizer 110 may perform an operation in response to the EQ control data EQCD. The equalizer 110 may perform the EMP operation based on the EQ control data EQCD. Alternatively or additionally, the equalizer 110 may perform the ODT operation based on the EQ control data EQCD.

The TX driver 120 may receive the transmission control data TXCD. The TX driver 120 may perform an operation in response to the transmission control data TXCD. The TX driver 120 may perform an OCD operation based on the transmission control data TXCD. For example, the TX driver 120 may perform an OCD operation based on the transmission control data TXCD generated based on the first TX code. The TX driver 120 may perform the ODT operation based on the transmission control data TXCD. For example, the TX driver 120 may perform an ODT operation based on the transmission control data TXCD generated based on the second TX code.

Figure 4:
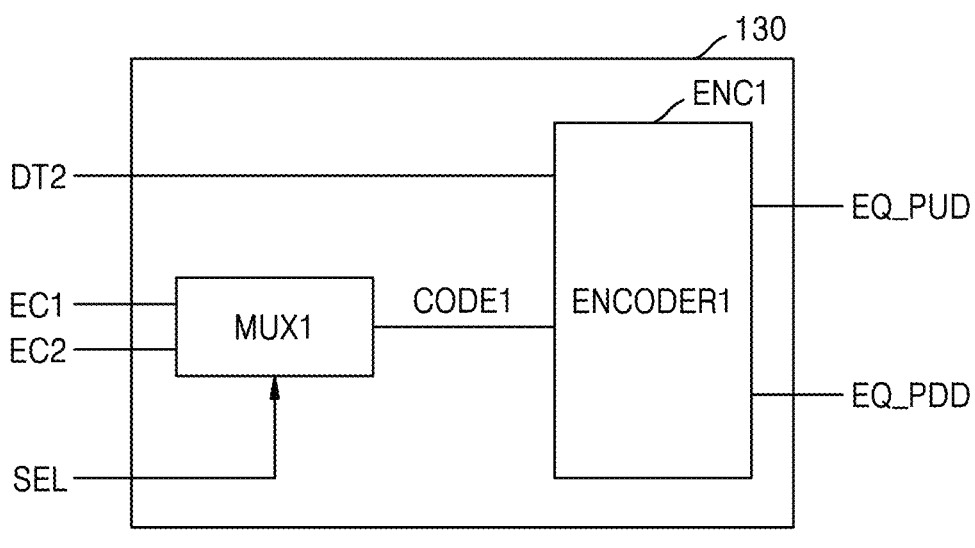
FIG. 4 is a block diagram of an equalizer (EQ) control circuit and a transmission control circuit, according to an embodiment.
Figure 4:
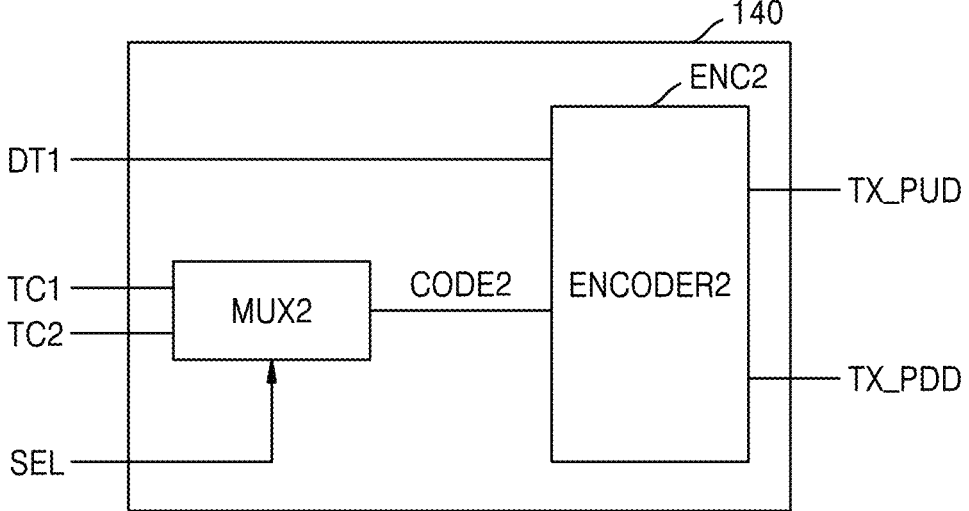

FIG. 4 is block diagram of the EQ control circuit 130 and the TX control circuit 140, according to an embodiment. FIG. 5 is a diagram for describing a first code CODE1 and a second code CODE2 according to example embodiments.

Referring to FIGS. 3, 4, and 5, the EQ control circuit 130 may include a first encoder ENC1 and a first multiplexer MUX1. The EQ control circuit 130 may receive the second data DT2, a first EQ code EC1, a second EQ code EC2, and a selection signal SEL. The EQ control circuit 130 may receive the second data DT2 from the delay circuit 160. The EQ control circuit 130 may receive the EQ code EC from the calibration circuit 170. The EQ code EC may include the first EQ code EC1 and the second EQ code EC2. The EQ control circuit 130 may receive the first EQ code EC1 and the second EQ code EC2 from the calibration circuit 170.

The first EQ code EC1 may correspond to the EMP operation, and the second EQ code EC2 may correspond to the ODT operation. In other words, the first EQ code EC1 may include a code used in the EMP operation, and the second EQ code EC2 may include a code used in the ODT operation. The first EQ code EC1 may be used for performing or controlling the EMP operation, and may include information about amplification intensity. The second EQ code EC2 may be used for performing or controlling the ODT operation, and may include information about an ODT resistance value.

For example, the calibration circuit 170 may be configured to determine optimal amplification intensity of the EMP operation by using the calibration operation, and set a value corresponding to the optimal amplification intensity as the first EQ code EC1. The calibration circuit 170 may be configured to determine an optimal resistance value of the ODT operation by using the calibration operation, and set a value corresponding to the optimal resistance value as the second EQ code EC2. The calibration circuit 170 may provide the first EQ code EC1 and the second EQ code EC2 to the EQ control circuit 130.

The first multiplexer MUX1 may receive the selection signal SEL, the first EQ code EC1 and the second EQ code EC2. The first multiplexer MUX1 may provide one of the first EQ code EC1 or the second EQ code EC2 as the first code CODE1 to the first encoder ENC1 in response to the selection signal SEL. The first multiplexer MUX1 may output either the first EQ code EC1 corresponding to a pre-emphasis operation or the second EQ code EC2 corresponding to an on die termination (ODT) operation as the first code CODE1 in response to the selection signal SEL.

In some embodiment, in the case of transmitting the signal SIG at the transmission end, the selection signal SEL may have a first value (for example, '0'). In the case of receiving the signal SIG at the reception end, the selection signal SEL may have a second value (for example, '1'). When the selection signal SEL has the first value (for example, '0') (that is, at the transmission end), the first multiplexer MUX1 may output the first EQ code EC1 to the first encoder ENC1 as the first code CODE1. When the selection signal SEL has the second value (for example, '1') (that is, at the reception end), the first multiplexer MUX1 may output the second EQ code EC2 to the first encoder ENC1 as the first code CODE1.

In other words, the first multiplexer MUX1 may output the first EQ code EC1 as the first code CODE1 in response to the selection signal SEL indicating the transmission operation. The first multiplexer MUX1 may output the second EQ code EC2 as the first code CODE1 in response to the selection signal SEL indicating the reception operation.

The first encoder ENC1 may receive the second data DT2 and the first code CODE1. The first encoder ENC1 may encode the second data DT2 and the first code CODE1 to generate EQ pull-up data EQ_PUD and EQ pull-down data EQ_PDD. The first encoder ENC1 may output the EQ pull-up data EQ_PUD and the EQ pull-down data EQ_PDD. The first encoder ENC1 may provide the EQ pull-up data EQ_PUD and the EQ pull-down data EQ_PDD to the equalizer 110. For example, the EQ pull-up data EQ_PUD may include a control value for controlling a plurality of pull-up drivers of the equalizer 110. The EQ pull-down data EQ_PDD may include a control value for controlling a plurality of pull-down drivers of the equalizer 110. In other words, a first encoder INC1 may encode codes provided by the second data DT2 and the first multiplexer MUX1 to output the EQ control data EQCD.

As described above, the EQ control circuit 130 may transmit the EQ control data EQCD to the equalizer 110. The EQ control data EQCD may include the EQ pull-up data EQ_PUD and the EQ pull-down data EQ_PDD. The EQ control circuit 130 may generate and output the EQ control data EQCD (for example, the EQ pull-up data EQ_PUD and the EQ pull-down data EQ_PDD) based on the first EQ code EC1 corresponding to the EMP operation in the transmission operation. The EQ control circuit 130 may generate and output the EQ control data EQCD (for example, the EQ pull-up data EQ_PUD and the EQ pull-down data EQ_PDD) based on the second EQ code EC2 corresponding to the ODT operation in the reception operation.

The TX control circuit 140 may include a second encoder ENC2 and a second multiplexer MUX2. The TX control circuit 140 may receive the first data DT1, a first TX code TC1, a second TX code TC2, and the selection signal SEL. The TX control circuit 140 may receive the first data DT1 from the serializer 150. The TX control circuit 140 may receive the TX code TC from the calibration circuit 170. The TX code TC may include the first TX code TC1 and the second TX code TC2. The TX control circuit 140 may receive the first TX code TC1 and the second TX code TC2 from the calibration circuit 170.

The first TX code TC1 may correspond to the OCD operation, and the second TX code TC2 may correspond to the ODT operation. In other words, the first TX code TC1 may include a code used in the OCD operation, and the second TX code TC2 may include a code used in the ODT operation. The first TX code TC1 may indicate the OCD operation, and may indicate output intensity. The second TX code TC2 may indicate the ODT operation, and may indicate the ODT resistance value.

For example, the calibration circuit 170 may determine an optimal output intensity of the OCD operation based on the calibration operation, and set the value of the optimal output intensity as the first TX code TC1. For example, the calibration circuit 170 may determine an optimal resistance value of the ODT operation based on the calibration operation, and set the optimal resistance value as the second TX code TC2. The calibration circuit 170 may provide the first TX code TC1 and the second TX code TC2 to the TX control circuit 140.

The second multiplexer MUX2 may receive the selection signal SEL, the first TX code TC1 and the second TX code TC2. The second multiplexer MUX2 may provide the first TX code TC1 or the second TX code TC2 to the second encoder ENC2 in response to the selection signal SEL. The second multiplexer MUX2 may output the first TX code TC1 corresponding to an off chip driver (OCD) or the second TX code TC2 corresponding to an on die termination (ODT) as the second code CODE2 in response to the selection signal SEL.

For example, when the selection signal SEL has the first value (for example, '0') (that is, at the transmission end), the second multiplexer MUX2 may output the first TX code TC1 to the second encoder ENC2 as the second code CODE2. When the selection signal SEL has the second value (for example, '1') (that is, at the reception end), the second multiplexer MUX2 may output the second TX code TC2 to the second encoder ENC2 as the second code CODE2.

For example, the second multiplexer MUX2 may output the first TX code TC1 as the second code CODE2 in response to the selection signal SEL indicating the transmission operation. The second multiplexer MUX2 may output the second TX code TC2 as the second code CODE2 in response to the selection signal SEL indicating the reception operation.

The second encoder ENC2 may receive the first data DT1 and the second code CODE2. The second encoder ENC2 may encode the first data DT1 and the second code CODE2 to generate TX pull-up data TX_PUD and TX pull-down data TX_PDD. The second encoder ENC2 may output the TX pull-up data TX_PUD and the TX pull-down data TX_PDD. The second encoder ENC2 may provide the TX pull-up data TX_PUD and the TX pull-down data TX_PDD to the TX driver 120. For example, the TX pull-up data TX_PUD may include a control value for controlling a plurality of pull-up drivers of the TX driver 120. The TX pull-down data TX_PDD may include a control value for controlling a plurality of pull-down drivers of the TX driver 120. In other words, the second encoder ENC2 may encode the first data DT1 and codes provided by the second multiplexer MUX2, and may output the transmission control data TXCD.

As described above, the TX control circuit 140 may transmit the transmission control data TXCD to the TX driver 120. The transmission control data TXCD may include the TX pull-up data TX_PUD and the TX pull-down data TX_PDD. The TX control circuit 140 may generate and output the transmission control data TXCD (for example, the TX pull-up data TX_PUD and the TX pull-down data TX_PDD) based on the first TX code TC1 corresponding to the OCD operation in the transmission operation. The TX control circuit 140 may generate and output the transmission control data TXCD (for example, TX pull-up data TX_PUD and TX pull-down data TX_PDD) based on the second TX code TC2 corresponding to the ODT operation in the reception operation.

Figure 6:
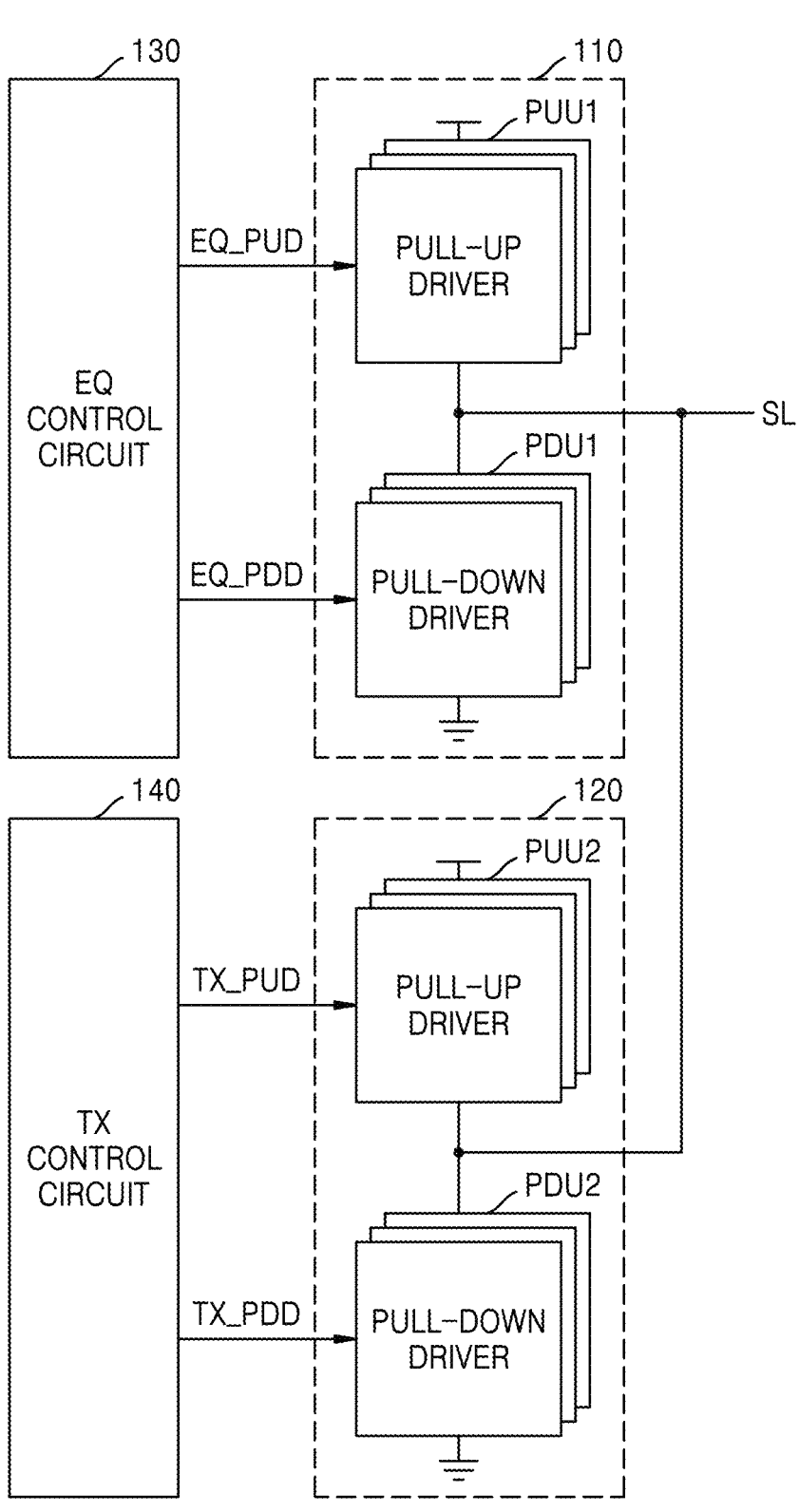
FIG. 6 is a block diagram of an equalizer and a TX driver, according to an embodiment.

FIG. 6 is a block diagram of the equalizer 110 and the TX driver 120, according to an embodiment.

Referring to FIGS. 3 and 6, the equalizer 110 may include a plurality of first pull-up drivers PUU1 and a plurality of first pull-down drivers PDU1. Each of the plurality of first pull-up drivers PUU1 may be connected between a power supply voltage and the signal line SL. Each of the plurality of first pull-down drivers PDU1 may be connected between the signal line SL and a ground voltage GND.

As described above, the EQ control circuit 130 may output the EQ control data EQCD to the equalizer 110. For example, the EQ control circuit 130 may provide the EQ pull-up data EQ_PUD and the EQ pull-down data EQ_PDD to the equalizer 110. Each of the plurality of first pull-up drivers PUU1 may receive the EQ pull-up data EQ_PUD. Each of the plurality of first pull-down drivers PDU1 may receive the EQ pull-down data EQ_PDD. Each of the plurality of first pull-up drivers PUU1 may operate based on the EQ pull-up data EQ_PUD. Each of the plurality of first pull-down drivers PDU1 may operate based on the EQ pull-down data EQ_PDD.

The TX driver 120 may include a plurality of second pull-up drivers PUU2 and a plurality of second pull-down drivers PDU2. Each of the plurality of second pull-up drivers PUU2 may be connected between the power supply voltage and the signal line SL. Each of the plurality of second pull-down drivers PDU2 may be connected between the signal line SL and the ground voltage GND.

As described above, the TX control circuit 140 may output the transmission control data TXCD to the TX driver 120. For example, the TX control circuit 140 may provide the TX pull-up data TX_PUD and the TX pull-down data TX_PDD to the TX driver 120. Each of the plurality of second pull-up drivers PUU2 may receive the TX pull-up data TX_PUD. Each of the plurality of second pull-down drivers PDU2 may receive the TX pull-down data TX_PDD. Each of the plurality of second pull-up drivers PUU2 may operate based on the TX pull-up data TX_PUD. Each of the plurality of second pull-down drivers PDU2 may operate based on the TX pull-down data TX_PDD.

As described above, the equalizer 110 and the TX driver 120 may be connected to the signal line SL. The equalizer 110 and the TX driver 120 may be connected to each other in parallel. Impedance of the signal line SL may be adjusted by using the plurality of first and second pull-up drivers PUU1 and PUU2, and the plurality of first and second pull-down drivers PDU1 and PDU2.

Figure 7:
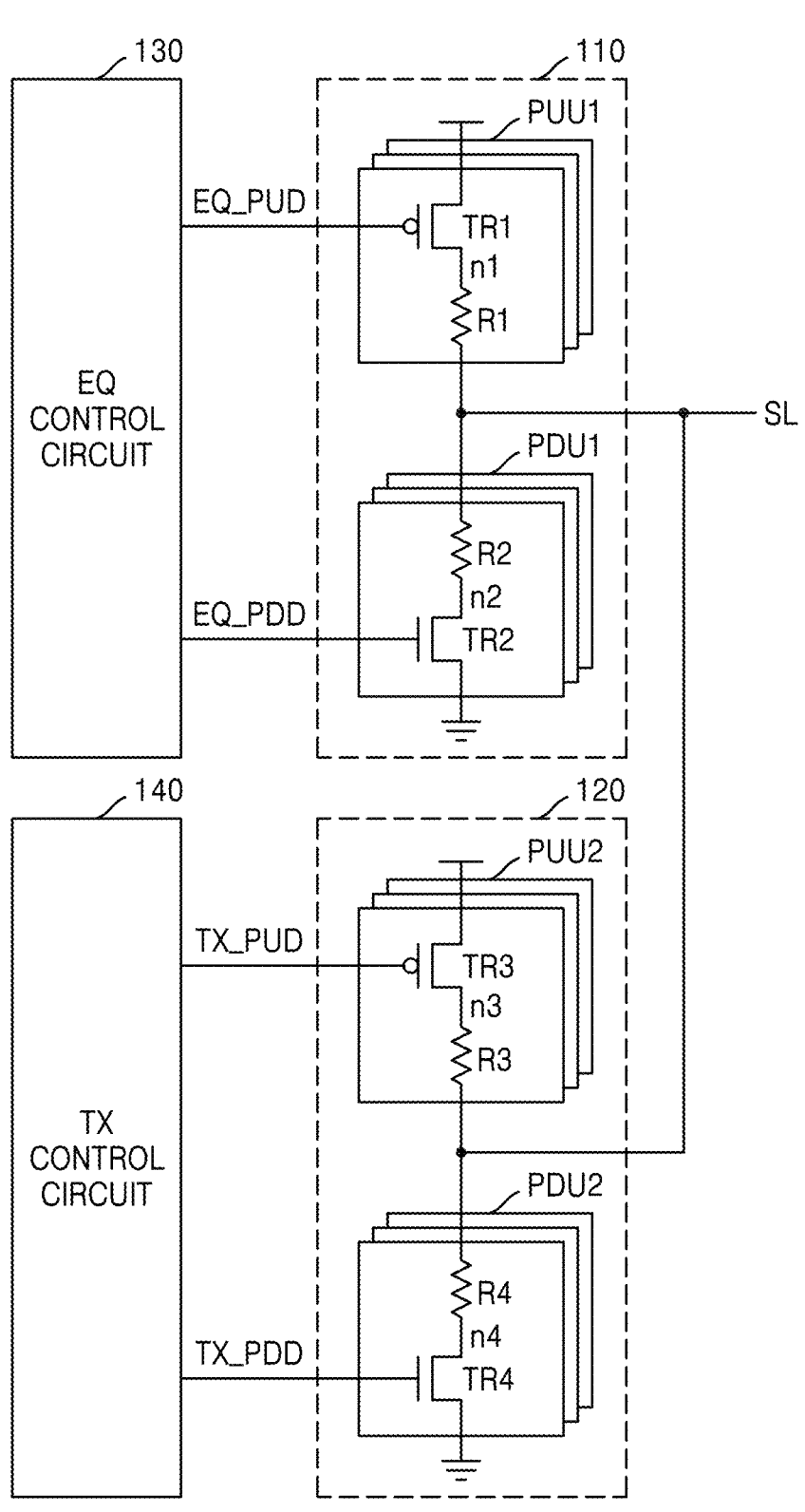
FIG. 7 is a block diagram of an equalizer and a TX driver, according to an embodiment.

FIG. 7 is a block diagram of the equalizer 110 and the TX driver 120, according to an embodiment.

Referring to FIGS. 3 and 7, the equalizer 110 may include the plurality of first pull-up drivers PUU1 and the plurality of first pull-down drivers PDU1. Each of the plurality of first pull-up drivers PUU1 may include a first transistor TR1 and a first resistor R1 (or a resistive device). The first transistor TR1 may be connected between the power supply voltage and the first resistor R1. In other words, the first transistor TR1 may be connected between the power supply voltage and a first node n1. The first transistor TR1 may operate in response to the EQ pull-up data EQ_PUD. The first resistor R1 may be connected between the first transistor TR1 and the signal line SL. For example, the first resistor R1 may be connected between the first node n1 and the signal line SL.

Each of the plurality of first pull-down drivers PDU1 may include a second transistor TR2 and a second resistor R2. The second resistor R2 may be connected between the signal line SL and the second transistor TR2. In other words, the second resistor R2 may be connected between the signal line SL and a second node n2. The second transistor TR2 may be connected between the second resistor R2 and the ground voltage GND. For example, the second transistor TR2 may be connected between the second node n2 and the ground voltage GND. The second transistor TR2 may operate in response to the EQ pull-down data EQ_PDD.

The TX driver 120 may include the plurality of second pull-up drivers PUU2 and the plurality of second pull-down drivers PDU2. Each of the plurality of second pull-up drivers PUU2 may include a third transistor TR3 and a third resistor R3. The third transistor TR3 may be connected between the power supply voltage and the third resistor R3. For example, the third transistor TR3 may be connected between the power supply voltage and a third node n3. The third transistor TR3 may operate in response to the TX pull-up data TX_PUD. The third resistor R3 may be connected between the third transistor TR3 and the signal line SL. For example, the third resistor R3 may be connected between the third node n3 and the signal line SL.

Each of the plurality of second pull-down drivers PDU2 may include a fourth transistor TR4 and a fourth resistor R4. The fourth resistor R4 may be connected between the signal line SL and the fourth transistor TR4. For example, the fourth resistor R4 may be connected between the signal line SL and a fourth node n4. The fourth transistor TR4 may be connected between the fourth resistor R4 and the ground voltage GND. For example, the fourth transistor TR4 may be connected between the fourth node n4 and the ground voltage GND. The fourth transistor TR4 may operate in response to the TX pull-down data TX_PDD.

In an embodiment, when the equalizer 110 is used as the ODT, the second transistor TR2 may be turned off. For example, when the equalizer 110 performs the ODT operation, the second transistor TR2 may be turned off. For example, the second transistor TR2 may be turned off in response to the EQ pull-down data EQ_PDD having a low level. When the TX driver 120 is used as the ODT, the fourth transistor TR4 may be turned off. For example, while the TX driver 120 performs the ODT operation, the fourth transistor TR4 may be turned off. For example, the fourth transistor TR may be turned off in response to the TX pull-down data TX_PDD having a low level.

For example, when the signal SIG is received, the first transistor TR1 may be turned on and the first resistor R1 may be connected between the power supply voltage and the signal line SL, and the second transistor TR2 may be turned off and the second resistor R2 may not be connected between the ground voltage GND and the signal line SL. When the first resistor R1 is connected between the power supply voltage and the signal line SL, reflection of the signal SIG transmitted via the signal line SL may be suppressed. When the signal SIG is received, the third transistor TR3 may be turned on and the third resistor R3 may be connected between the power supply voltage and the signal line SL, and the fourth transistor TR4 may be turned off and the fourth resistor R4 may not be connected between the ground voltage GND and the signal line SL. When the third resistor R3 is connected between the power supply voltage and the signal line SL, reflection of the signal SIG transmitted via the signal line SL may be suppressed. Impedance matching for the signal line SL may be achieved by turning on or off the first and third transistors TR1 and TR3 and turning off the second and fourth transistors TR2 and TR4.

Figure 8:
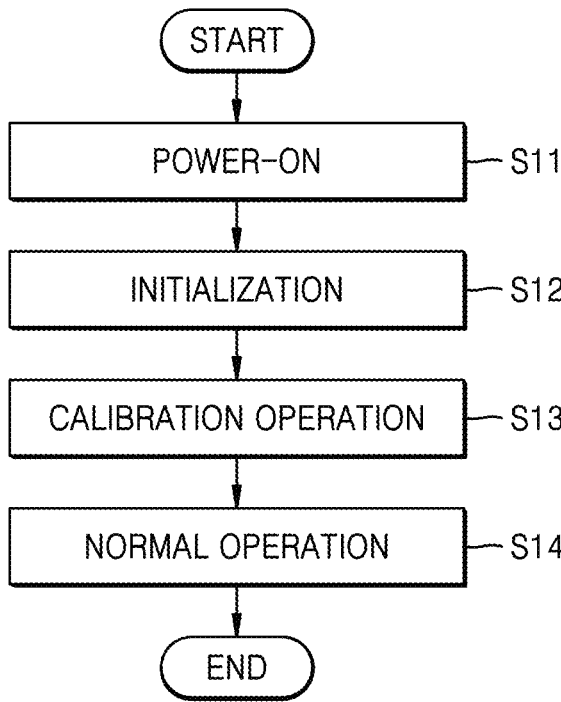
FIG. 8 is a flowchart of an operation of integrated circuit devices, according to an embodiment.

FIG. 8 is a flowchart of an operation of the first and second integrated circuit devices 11 and 12, according to an embodiment.

Referring to FIG. 8, a calibration operation for generating codes of the first and second integrated circuit devices 11 and 12. However, the scope of the inventive concept is not limited thereto. Referring to FIGS. 1, 3, and 8, in operation S11, the first and second integrated circuit devices 11 and 12 may be turned on.

In operation S12, the first and second integrated circuit devices 11 and 12 may perform an initialization operation. For example, the first and second integrated circuit devices 11 and 12 may perform the initialization operation of setting various pieces of information required for operating the first and second integrated circuit devices 11 and 12 according to a pre-defined method.

In operation S13, the first and second integrated circuit devices 11 and 12 may perform the calibration operation. In an embodiment, the first and second integrated circuit devices 11 and 12 may generate codes by using the calibration operation. Alternatively or additionally, the first and second integrated circuit devices 11 and 12 may determine values of the codes by performing the calibration operation.

In an embodiment, the first and second integrated circuit devices 11 and 12 may generate the EQ code used by the equalizer 110. The first and second integrated circuit devices 11 and 12 may generate the first EQ code EC1 corresponding to the amplification intensity of the equalizer 110. The first and second integrated circuit devices 11 and 12 may generate the first EQ code EC1 corresponding to the EMP operation of the equalizer 110 to remove the signal interference. The first and second integrated circuit devices 11 and 12 may generate the second EQ code EC2 corresponding to the ODT resistance value of the equalizer 110. The first and second integrated circuit devices 11 and 12 may generate the second EQ code EC2 corresponding to the ODT operation of the equalizer 110 to prevent signal distortion caused by reflected waves.

In an embodiment, the first and second integrated circuit devices 11 and 12 may generate the TX code used by the TX driver 120. The first and second integrated circuit devices 11 and 12 may generate the first TX code TC1 corresponding to the output intensity of the TX driver 120. The first and second integrated circuit devices 11 and 12 may generate the first TX code TC1 corresponding to the OCD operation of the TX driver 120 to achieve impedance matching of the data line. The first and second integrated circuit devices 11 and 12 may generate the second TX code TC2 corresponding to the ODT resistance value of the TX driver 120. The first and second integrated circuit devices 11 and 12 may generate the second TX code TC2 corresponding to the ODT operation of the TX driver 120 to prevent signal distortion caused by the reflected waves In operation S14, the first and second integrated circuit devices 11 and 12 may perform a normal operation. For example, the first and second integrated circuit devices 11 and 12 may determine whether a signal is being received or transmitted. The first and second integrated circuit devices 11 and 12 may generate the selection signal SEL indicating a transmission operation or a reception operation. The first and second integrated circuit devices 11 and 12 may determine the first code CODE1 and the second code CODE2 based on the selection signal SEL.

During a normal operation, the first and second integrated circuit devices 11 and 12 may encode the second data DT2 based on the first code CODE1, and control the equalizer 110 based on the encoded second data (e.g., the EQ control data EQCD). The first and second integrated circuit devices 11 and 12 may encode the first data DT1 based on the second code CODE2, and control the TX driver 120 based on the encoded first data (e.g., the transmission control data TXCD).

The operations of the first and second integrated circuit devices 11 and 12 described above are examples, and the scope of the inventive concept is not limited thereto. For example, the calibration operation may be performed in a different manner. For example, while the first and second integrated circuit devices 11 and 12 are operating, the calibration operation may be performed according to various requirements such as temperature change.

Figure 9:
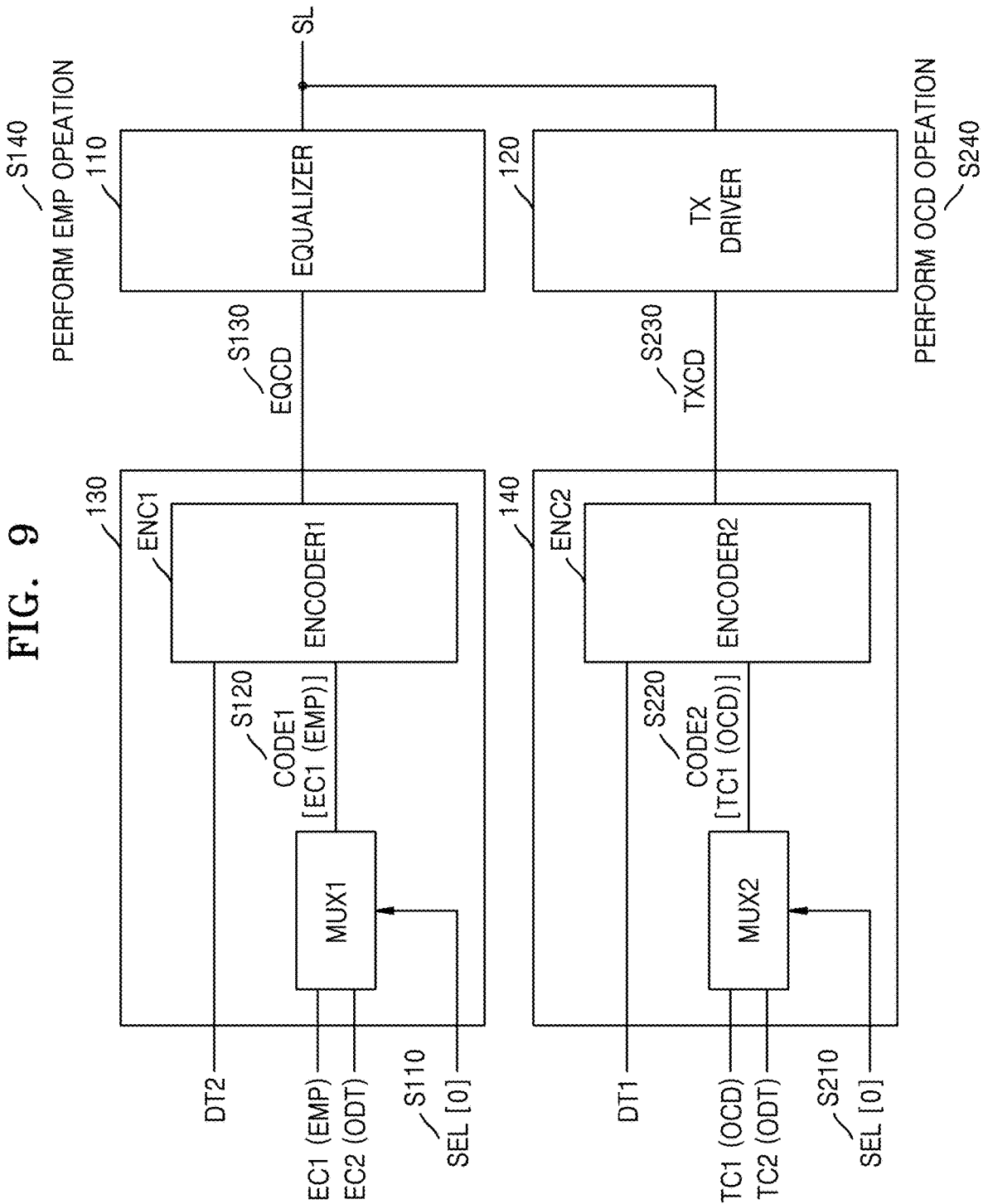
FIG. 9 is a diagram of operations of integrated circuit devices, according to an embodiment.
Figure 10:
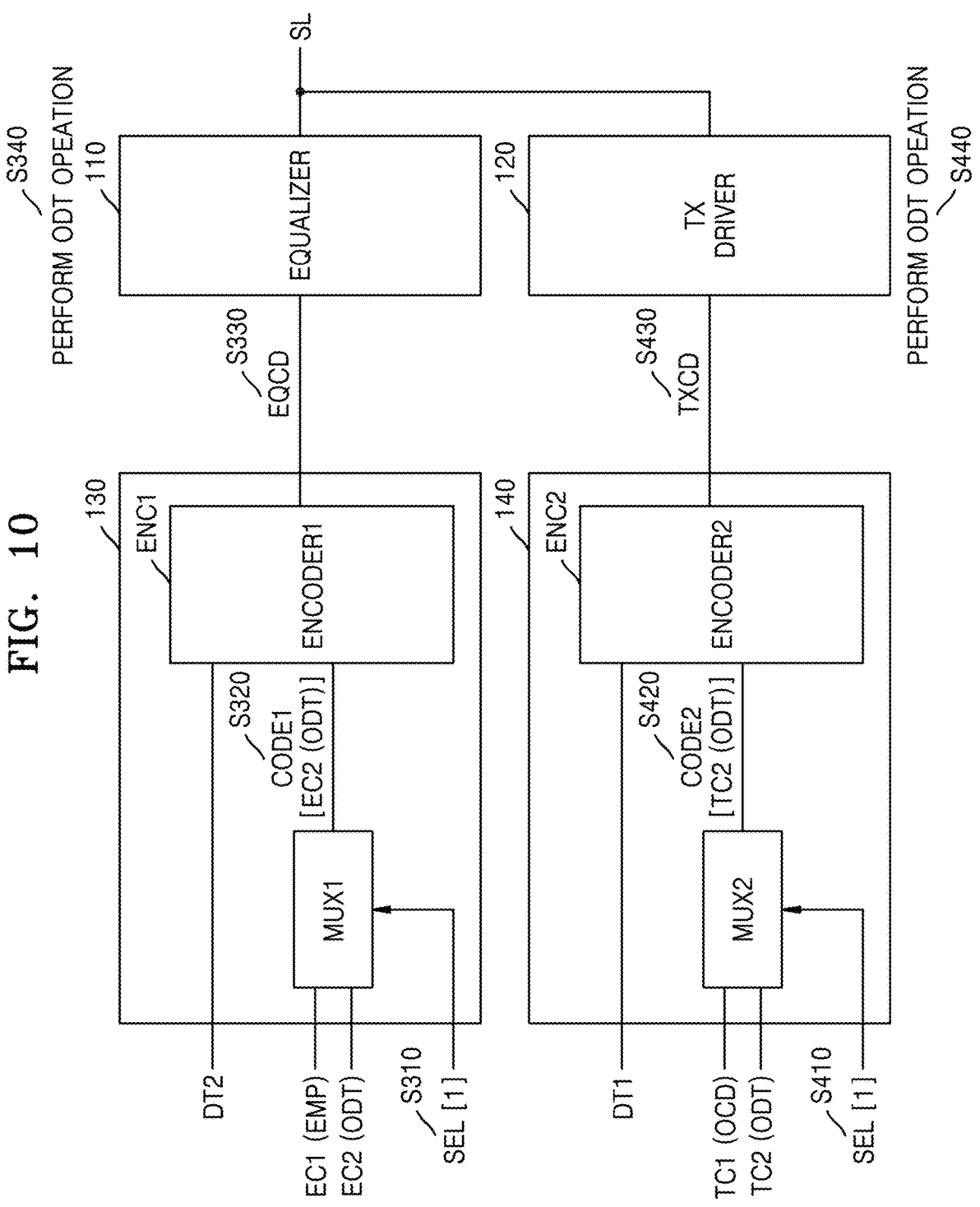
FIG. 10 is a diagram of operations of integrated circuit devices, according to an embodiment.

FIG. 9 is a diagram of operations of the first and second integrated circuit devices 11 and 12, according to an embodiment. FIG. 10 is a diagram of operations of the first and second integrated circuit devices 11 and 12, according to an embodiment.

The operations of the first and second integrated circuit devices 11 and 12 at the transmission end are described with reference to FIG. 9, and the operations of the first and second integrated circuit devices 11 and 12 at the reception end are described with reference to FIG. 10.

Referring to FIGS. 1, 3 and 9, at the transmission end, the selection signal SEL may have the first value (for example, '0'). For example, the first integrated circuit device 11 may further include a command decoder. The command decoder may set the selection signal SEL to the first value (for example, '0') in response to a read command. In some embodiments, the calibration circuit 170 may set the selection signal SEL to the first value (for example, '0').

In operation S110, the first multiplexer MUX1 may receive the selection signal SEL having the first value (for example, '0'). In other words, the first multiplexer MUX1 may receive the selection signal SEL indicating the transmission operation.

In operation S120, the first multiplexer MUX1 may output the first code CODE1 in response to the selection signal SEL having the first value. In response to the selection signal SEL indicating the transmission operation, the first multiplexer MUX1 may select, as the first code CODE1, the first EQ code EC1 among the first EQ code EC1 corresponding to the EMP operation and the second EQ code EC2 corresponding to the ODT operation.

For example, because the selection signal SEL has the first value (for example, '0'), the first multiplexer MUX1 may output the first EQ code EC1 as the first code CODE1. In other words, the first multiplexer MUX1 at the transmission end (for example, the first multiplexer MUX1 of the first integrated circuit device 11) may provide the first EQ code EC1, which is a code corresponding to the EMP operation, to the first encoder ENC1.

Figure 11:
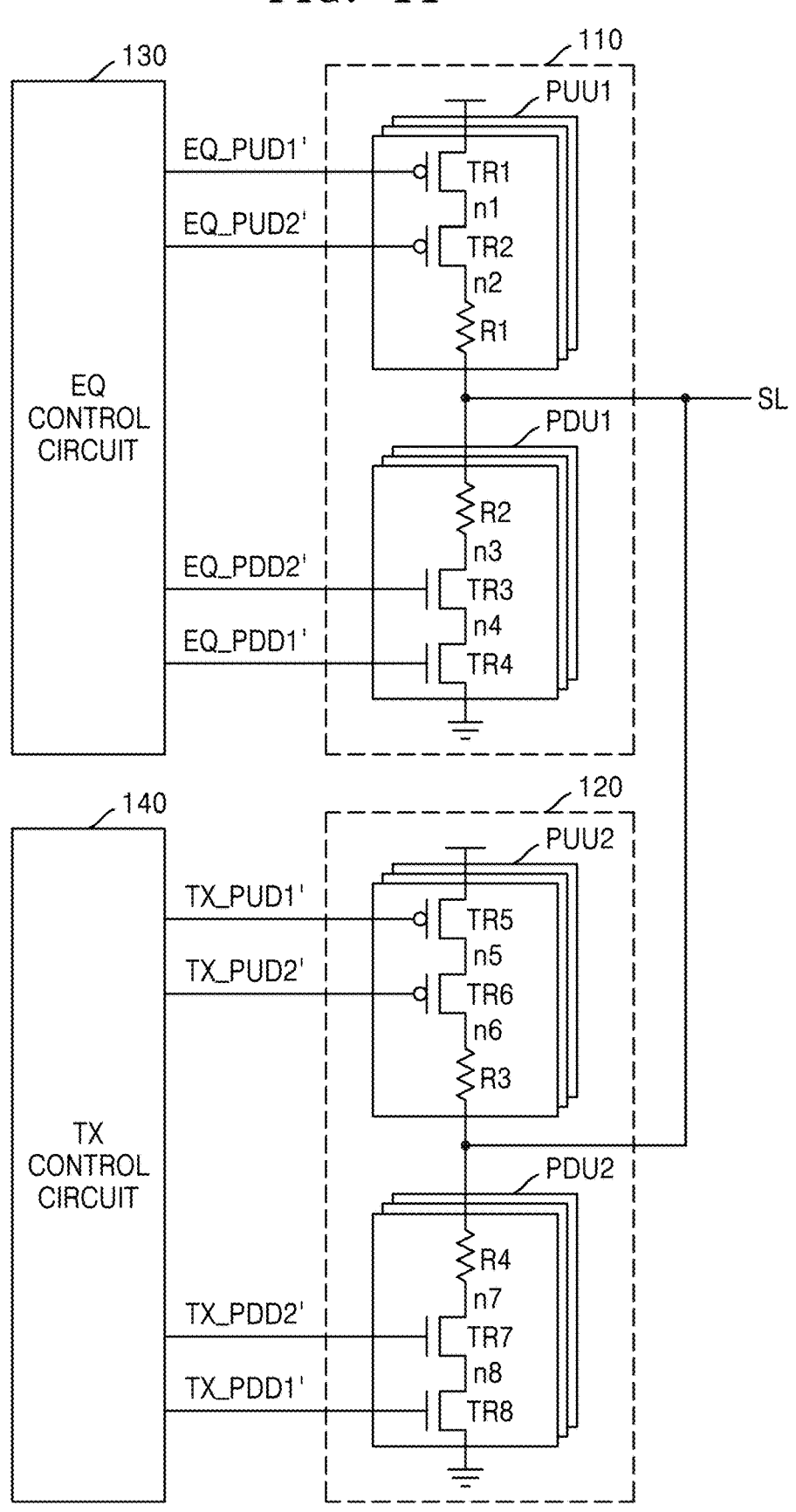
FIG. 11 is a block diagram of an equalizer and a TX driver, according to an embodiment.

For example, the first EQ code EC1 may include a code received by each of the plurality of first pull-up drivers PUU1 in FIG. 11 and a code received by each of the plurality of first pull-down drivers PDU1 in FIG. 11. In one embodiment, the code of the first EQ code received by each of the plurality of first pull-up drivers PUU1 may be the same as or different from the code of the first EQ code received by each of the plurality of first pull-down drivers PDU1.

In operation S130, the first encoder ENC1 may generate the EQ control data EQCD, and output the generated EQ control data EQCD to the equalizer 110. The first encoder ENC1 may encode the second data DT2 and the first code CODE1, and generate the EQ control data EQCD (for example, the EQ pull-up data EQ_PUD and the EQ pull-down data EQ_PDD). The first encoder ENC1 may provide the EQ pull-up data EQ_PUD and the EQ pull-down data EQ_PDD to the equalizer 110.

For example, the first encoder ENC1 at the transmission end (for example, the first encoder ENC1 of the first integrated circuit device 11) may generate the EQ control data EQCD and output the EQ control data EQCD to the equalizer 110. For example, the EQ control data EQCD may include a first EQ pull-up data EQ_PUD1', a second EQ pull-up data EQ_PUD2', a first EQ pull-down data EQ_PDD1', and a second EQ pull-down data EQ_PDD2' of FIG. 11. The first EQ pull-up data EQ_PUD1' and the second EQ pull-up data EQ_PUD2' may include a control value for controlling each of the plurality of first pull-up drivers PUU1 of the equalizer 110, when performing the EMP operation. The first EQ pull-down data EQ_PDD1', and the second EQ pull-down data EQ_PDD2' may include a control value for controlling each of the plurality of first pull-down drivers PDU1 of the equalizer 110, when performing the EMP operation. In other words, the EQ control circuit 130 may output the EQ control data EQCD corresponding to the EMP operation to the equalizer 110.

In operation S140, the equalizer 110 may perform the EMP operation. The equalizer 110 may receive the EQ control data EQCD. For example, the equalizer 110 may receive the first EQ pull-up data EQ_PUD1', the second EQ pull-up data EQ_PUD2', the first EQ pull-down data EQ_PDD1', and the second EQ pull-down data EQ_PDD2'. The equalizer 110 may perform the EMP operation based on the EQ control data EQCD. The equalizer 110 may intensify high frequency components of the signal SIG based the EQ control data EQCD.

In operation S210, the second multiplexer MUX2 may receive the selection signal SEL having the first value (for example, '0'). In other words, the second multiplexer MUX2 may receive the selection signal SEL indicating the transmission operation.

In operation S220, the second multiplexer MUX2 may output the second code CODE2 in response to the selection signal SEL having the first value. In response to the selection signal SEL indicating the transmission operation, the second multiplexer MUX2 may select the first TX code TC1, as the second code CODE2, among the first TX code TC1 corresponding to the OCD operation and the second TX code TC2 corresponding to the ODT operation.

For example, because the selection signal SEL has the first value (for example, '0'), the second multiplexer MUX2 may output the second code CODE2. In other words, the second multiplexer MUX2 (for example, the second multiplexer MUX2 of the first integrated circuit device 11) at the transmission end may provide the first TX code TC1, which is a code corresponding to the OCD operation, to the second encoder ENC2.

For example, the first TX code TC1 may include a code received by each of the plurality of second pull-up drivers PUU2 and a code received by each of the plurality of second pull-down drivers PDU2. In one embodiment, the code of the first TX code TC1 received by each of the plurality of second pull-up drivers PUU2 may be the same as or different from the code of the first TX code TC1 received by each of the plurality of second pull-down drivers PDU2.

In operation S230, the second encoder ENC2 may generate the transmission control data TXCD, and output the generated transmission control data TXCD to the TX driver 120. The second encoder ENC2 may encode the first data DT1 and the second code CODE2, and generate the transmission control data TXCD (for example, the TX pull-up data TX_PUD and the TX pull-down data TX_PDD). The second encoder ENC2 may provide the TX pull-up data TX_PUD and the TX pull-down data TX_PDD to the TX driver 120.

For example, the second encoder ENC2 at the transmission end (for example, the second encoder ENC2 of the first integrated circuit device 11) may generate the transmission control data TXCD, and output the transmission control data TXCD to the TX driver 120. For example, the transmission control data TXCD may include a first TX pull-up data TX_PUD1', a second TX pull-up data TX_PUD2', a first TX pull-down data TX_PDD1', and a second TX pull-down data TX_PDD2' of FIG. 11. The first TX pull-up data TX_PUD1', and the second TX pull-up data TX_PUD2' may include a control value for controlling each of the plurality of second pull-up drivers PUU2 of the TX driver 120, when performing the OCD operation. The first TX pull-down data TX_PDD1', and the second TX pull-down data TX_PDD2' may include a control value for controlling each of the plurality of second pull-down drivers PDU2 of the TX driver 120, when performing the OCD operation. In other words, the TX control circuit 140 at the transmission end may output the transmission control data TXCD corresponding to the OCD operation to the TX driver 120.

In operation S240, the TX driver 120 may perform the OCD operation. The TX driver 120 may receive the transmission control data TXCD. For example, The TX driver 120 may receive the first TX pull-up data TX_PUD1', the second TX pull-up data TX_PUD2', the first TX pull-down data TX_PDD1', and the second TX pull-down data TX_PDD2'. The TX driver 120 may perform the OCD operation based on the transmission control data TXCD. The TX driver 120 may drive the signal line SL based on the transmission control data TXCD.

Operations S110 through S140 may be performed simultaneously with operations S210 through S240, and may be performed in an interchangeable order. When one or more embodiments may be implemented differently, the order of the particular operations may be performed differently from the order described above. For example, two operations described in succession may be performed substantially and simultaneously or in an opposite order to the described order.

Referring to FIGS. 1, 3, and 10, at the reception end, the selection signal SEL may have the second value (for example, '1'). For example, the second integrated circuit device 12 may further include a command decoder. The command decoder may set the selection signal SEL to the second value (for example, '1') in response to a write command. In some embodiments, the calibration circuit 170 may set the selection signal SEL to the second value (for example, '1').

In operation S310, the first multiplexer MUX1 may receive the selection signal SEL having the second value (for example, '1'). In other words, the first multiplexer MUX1 may receive the selection signal SEL indicating the reception operation.

In operation S320, the first multiplexer MUX1 may output the first code CODE1 in response to the selection signal SEL having the second value. In response to the selection signal SEL indicating the reception operation, the first multiplexer MUX1 may select, as the first code CODE1, the second EQ code EC2 from among the first EQ code EC1 corresponding to the EMP operation and the second EQ code EC2 corresponding to the ODT operation.

For example, because the selection signal SEL has the second value (for example, '1'), the first multiplexer MUX1 may output the second EQ code EC2 as the first code CODE1. In other words, the first multiplexer MUX1 (for example, the first multiplexer MUX1 of the second integrated circuit device 12) at the reception end may provide the second EQ code EC2, which is a code corresponding to the ODT operation, to the first encoder ENC1.

For example, the second EQ code EC2 may include a code received by each of the plurality of first pull-up drivers PUU1 and a code received by each of the plurality of first pull-down drivers PDU1. In one embodiment, the code of the second EQ code EC2 received by each of the plurality of first pull-up drivers PUU1 may be the same as or different from the code of the second EQ code EC2 received by each of the plurality of first pull-down drivers PDU1.

In operation S330, the first encoder ENC1 may generate the EQ control data EQCD, and output the generated EQ control data EQCD to the equalizer 110. The first encoder ENC1 may encode the second data DT2 and the first code CODE1, and generate the EQ control data EQCD (for example, the EQ pull-up data EQ_PUD and the EQ pull-down data EQ_PDD). The first encoder ENC1 may provide the EQ pull-up data EQ_PUD and the EQ pull-down data EQ_PDD to the equalizer 110.

For example, the first encoder ENC1 at the reception end (for example, the first encoder ENC1 of the second integrated circuit device 12) may generate the EQ control data EQCD and output the EQ control data EQCD to the equalizer 110. For example, the EQ control data EQCD may include the first EQ pull-up data EQ_PUD1', the second EQ pull-up data EQ_PUD2', the first EQ pull-down data EQ_PDD1', and the second EQ pull-down data EQ_PDD2'. The first EQ pull-up data EQ_PUD1', and the second EQ pull-up data EQ_PUD2' may include a control value for controlling each of the plurality of first pull-up drivers PUU1 of the equalizer 110, when performing the ODT operation. The first EQ pull-down data EQ_PDD1', and the second EQ pull-down data EQ_PDD2' may include a control value for controlling each of the plurality of first pull-down drivers PDU1 of the equalizer 110, when performing the ODT operation. In other words, the EQ control circuit 130 at the reception end may output the EQ control data EQCD corresponding to the ODT operation to the equalizer 110.

In operation S340, the equalizer 110 may perform the ODT operation. The equalizer 110 may receive the EQ control data EQCD. For example, the equalizer 110 may receive the first EQ pull-up data EQ_PUD1', the second EQ pull-up data EQ_PUD2', the first EQ pull-down data EQ_PDD1', and the second EQ pull-down data EQ_PDD2'. The equalizer 110 may perform the ODT operation based on. The equalizer 110 may determine the magnitude of the ODT resistance based on the EQ control data EQCD. The equalizer 110 may prevent signal distortion due to reflected waves by using the ODT operation. The termination resistance of the equalizer 110 may be determined based on the EQ control data EQCD. The termination resistance value of the equalizer 110 may be adjusted to be equal to the impedance of the signal line SL. The equalizer 110 may absorb energy of a signal transmitted via the signal line SL, and prevent reflection of the signal at the reception end.

In operation S410, the second multiplexer MUX2 may receive the selection signal SEL having the second value (for example, '1'). In other words, the second multiplexer MUX2 may receive the selection signal SEL indicating the reception operation.

In operation S420, the second multiplexer MUX2 may output the second code CODE2 in response to the selection signal SEL having the second value. In response to the selection signal SEL indicating the reception operation, the second multiplexer MUX2 may select the second TX code TC2, as the second code CODE2, among the first TX code TC1 corresponding to the OCD operation and the second TX code TC2 corresponding to the ODT operation.

For example, because the selection signal SEL has the second value (for example, '1'), the second multiplexer MUX2 may output the second code CODE2. In other words, the second multiplexer MUX2 at the reception end (for example, the second multiplexer MUX2 of the second integrated circuit device 12) may provide the second TX code TC2, which is a code corresponding to the ODT operation, to the second encoder ENC2.

For example, the second TX code TC2 may include a code received by each of the plurality of second pull-up drivers PUU2 and a code received by each of the plurality of second pull-down drivers PDU2. In one embodiment, the code of the second TX code TC2 received by each of the plurality of second pull-up drivers PUU2 may be the same as or different from the code of the second TX code TC2 received by each of the plurality of second pull-down drivers PDU2.

In operation S430, the second encoder ENC2 may generate the transmission control data TXCD, and output the generated transmission control data TXCD to the TX driver 120. The second encoder ENC2 may encode the first data DT1 and the second code CODE2, and generate the transmission control data TXCD (for example, the TX pull-up data TX_PUD and the TX pull-down data TX_PDD). The second encoder ENC2 may provide the TX pull-up data TX_PUD and the TX pull-down data TX_PDD to the TX driver 120. For example, the second encoder ENC2 at the reception end (for example, the second encoder ENC2 of the second integrated circuit device 12) may generate the transmission control data TXCD, and output the transmission control data TXCD to the TX driver 120. For example, the transmission control data TXCD may include the first TX pull-up data TX_PUD1', the second TX pull-up data TX_PUD2', the first TX pull-down data TX_PDD1', and the second TX pull-down data TX_PDD2'. The first TX pull-up data TX_PUD1', and the second TX pull-up data TX_PUD2' may include a control value for controlling each of the plurality of second pull-up drivers PUU2 of the TX driver 120, when performing the ODT operation. The first TX pull-down data TX_PDD1', and the second TX pull-down data TX_PDD2' may include a control value for controlling each of the plurality of second pull-down drivers PDU2 of the TX driver 120, when performing the ODT operation. In other words, the TX control circuit 140 at the reception end may output the transmission control data TXCD corresponding to the ODT operation to the TX driver 120.

In operation S440, the TX driver 120 may perform the ODT operation. The TX driver 120 may receive the transmission control data TXCD. For example, the TX driver 120 may receive the first TX pull-up data TX_PUD1', the second TX pull-up data TX_PUD2', the first TX pull-down data TX_PDD1', and the second TX pull-down data TX_PDD2'. The TX driver 120 may perform the ODT operation based on the transmission control data TXCD. The termination resistance value of the TX driver 120 may be determined based on the transmission control data TXCD. The termination resistance value of the TX driver 120 may be adjusted to be equal to the impedance of the signal line SL. The TX driver 120 may absorb energy of a signal transmitted via the signal line SL, and prevent reflection of the signal at the reception end.

Operations S310 through S340 may be performed simultaneously with operations S410 through S440, and may be performed in an interchangeable order. When one or more embodiments may be implemented differently, the order of the particular operations may be performed differently from the order described above. For example, two operations described in succession may be performed substantially and simultaneously or in an opposite order to the described order.

FIG. 11 is a block diagram of the equalizer 110 and the TX driver 120, according to an embodiment.

Referring to FIGS. 3, 4 and 11, the EQ control circuit 130 may receive the second data DT2 from the delay circuit 160. The EQ control circuit 130 may receive the first EQ code EC1 and the second EQ code EC2 from the calibration circuit 170. The EQ control circuit 130 may receive the selection signal SEL indicating whether the signal SIG is being received or transmitted.

For example, the EQ control circuit 130 may select and output, as the first code CODE1, the first EQ code EC1 in response to the selection signal SEL indicating the transmission operation. The EQ control circuit 130 may select and output, as the first code CODE1, the second EQ code EC2 in response to the selection signal SEL indicating the reception operation. The EQ control circuit 130 may provide an EQ control data EQCD to the equalizer 110.

In an embodiment, the EQ control circuit 130 may provide the EQ control data EQCD to the equalizer 110. For example, the EQ control circuit 130 may provide a first EQ pull-up data EQ_PUD1', a second EQ pull-up data EQ_PUD2', a first EQ pull-down data EQ_PDD1', and a second EQ pull-down data EQ_PDD2' to the equalizer 110. In the reception operation, the first EQ pull-up data EQ_PUD1' and the first EQ pull-down data EQ_PDD1' may be generated based on the first code CODE1, and the second EQ pull-up data EQ_PUD2' and the second EQ pull-down data EQ_PDD2' may be generated based on the second code CODE2. In the transmission operation, the first TX pull-up data TX_PUD1' and the first TX pull-down data TX_PDD1' may be generated based on the first code CODE1, and the second TX pull-up data TX_PUD2' and the second TX pull-down data TX_PDD2' may be generated based on the second code CODE2.

The TX control circuit 140 may receive the first data DT1 from the serializer 150. The TX control circuit 140 may receive the first TX code TC1 and the second TX code TC2 from the calibration circuit 170. The TX control circuit 140 may receive the selection signal SEL indicating whether the signal SIG is being received or transmitted.

The TX control circuit 140 may select and output, as the second code CODE2, the first TX code TC1 among the first TX code TC1 and the second TX code TC2 in response to the selection signal SEL indicating the transmission operation. Alternatively, the TX control circuit 140 may select and output, as the second code CODE2, the second TX code TC2 among the first TX code TC1 and the second TX code TC2 in response to the selection signal SEL indicating the reception operation. The TX control circuit 140 may provide a transmission control data TXCD to the TX driver 120.

In an embodiment, the TX control circuit 140 may output the TX control data TXCD to the TX driver 120. For example, the TX control circuit 140 may provide a first TX pull-up data TX_PUD1', a second TX pull-up data TX_PUD2', a first TX pull-down data TX_PDD1', and a second TX pull-down data TX_PDD2' to the TX driver 120. The first and second TX pull-up data TX_PUD1' and TX_PUD2' may be generated based on the second code CODE2, and the first and second TX pull-down data TX_PDD1' and TX_PDD2' may be generated based on the first data DT1. In the reception operation, the first TX pull-up data TX_PUD1' may be generated based on the second code CODE2, and the second TX pull-up data TX_PUD2' and the first and second TX pull-down data TX_PDD1' and TX_PDD2' may be fixed to low. In the transmission operation, the first TX pull-up data TX_PUD1' and the first TX pull-down data TX_PDD1' may be generated based on the second code CODE2, and the second TX pull-up data TX_PUD2' and the second TX pull-down data TX_PDD2' may be generated based on the first data DT1.

The equalizer 110 may include the plurality of first pull-up drivers PUU1 and the plurality of first pull-down drivers PDU1. Each of the plurality of first pull-up drivers PUU1 may include a first transistor TR1, a second transistor TR2, and a first resistor R1. The first transistor TR1 may be connected between the power supply voltage and the second transistor TR2. For example, the first transistor TR1 may be connected between the power supply voltage and a first node n1. The first transistor TR1 may operate in response to the first EQ pull-up data EQ_PUD1'. The second transistor TR2 may be connected between the first transistor TR1 and the first resistor R1. For example, the second transistor TR2 may be connected between the first node n1 and a second node n2. The second transistor TR2 may operate in response to the second EQ pull-up data EQ_PUD2'. The first resistor R1 may be connected between the second transistor TR2 and the signal line SL. For example, the first resistor R1 may be connected between the second node n2 and the signal line SL.

Each of the plurality of first pull-down drivers PDU1 may include a third transistor TR3, a fourth transistor TR4, and a second resistor R2. The second resistor R2 may be connected between the signal line SL and the third transistor TR3. For example, the second resistor R2 may be connected between the signal line SL and a third node n3. The third transistor TR3 may be connected between the second resistor R2 and the fourth transistor TR4. For example, the third transistor TR3 may be connected between the third node n3 and a fourth node n4. The third transistor TR3 may operate in response to the second EQ pull-down data EQ_PDD2'. The fourth transistor TR4 may be connected between the third transistor TR3 and the ground voltage GND. For example, the fourth transistor TR4 may be connected between the fourth node n4 and the ground voltage GND. The fourth transistor TR4 may operate in response to the first EQ pull-down data EQ_PDD1'.

The TX driver 120 may include the plurality of second pull-up drivers PUU2 and the plurality of second pull-down drivers PDU2. Each of the plurality of second pull-up drivers PUU2 may include a fifth transistor TR5, a sixth transistor TR6, and a third resistor R3. The fifth transistor TR5 may be connected between the power supply voltage and the sixth transistor TR6. For example, the fifth transistor TR5 may be connected between the power supply voltage and a fifth node n5. The fifth transistor TR5 may operate in response to the first TX pull-up data TX_PUD1'. the sixth transistor TR6 may be connected between the fifth transistor TR5 and the third resistor R3. For example, the sixth transistor TR6 may be connected between the fifth node n5 and a sixth node n6. The sixth transistor TR6 may operate in response to the second TX pull-up data TX_PUD2'. The third resistor R3 may be connected between the sixth transistor TR6 and the signal line SL. For example, the third resistor R3 may be connected between the sixth node n6 and the signal line SL.

Each of the plurality of second pull-down drivers PDU2 may include a seventh transistor TR7, an eighth transistor TR8, and a fourth resistor R4. The fourth resistor R4 may be connected between the signal line SL and the seventh transistor TR7. For example, the fourth resistor R4 may be connected between the signal line SL and a seventh node n7. The seventh transistor TR7 may be connected between the fourth resistor R4 and the eighth transistor TR8. For example, the seventh transistor TR7 may be connected between the seventh node n7 and an eighth node n8. The seventh transistor TR7 may operate in response to the second TX pull-down data TX_PDD2'. The eighth transistor TR8 may be connected between the seventh transistor TR7 and the ground voltage GND. For example, the eighth transistor TR8 may be connected between the eighth node n8 and the ground voltage GND. The eighth transistor TR8 may operate in response to the first TX pull-down data TX_PDD1'.

In an embodiment, when the signal SIG is received, the first and second transistors TR1 and TR2 may be turned on and the first resistor R1 may be electrically connected between the power supply voltage and the signal line SL, and the third and fourth transistors TR3 and TR4 may be turned off and the second resistor R2 may not be electrically connected between the ground voltage GND and the signal line SL. When the first resistor R1 is electrically connected between the power supply voltage and the signal line SL, reflection of the signal SIG transmitted via the signal line SL may be suppressed. Impedance matching for the signal line SL may be achieved by turning on or off the first transistor TR1, turning on the second transistor TR2, and turning off the third and fourth transistors TR3 and TR4. For example, when the signal SIG is received, the second EQ pull-up data EQ_PUD2' and the second EQ pull-down data EQ_PDD2' may be fixed to a low level (e.g., GND).

In an embodiment, when the signal SIG is received, the fifth and sixth transistors TR5 and TR6 may be turned on and the third resistor R3 may be electrically connected between the power supply voltage and the signal line SL, and the seventh and eighth transistors TR7 and TR8 may be turned off and the fourth resistor R4 may not be electrically connected between the ground voltage GND and the signal line SL. When the third resistor R3 is electrically connected between the power supply voltage and the signal line SL, reflection of the signal SIG transmitted via the signal line SL may be suppressed. Impedance matching for the signal line SL may be achieved by turning on or off the fifth transistor TR5, turning on the sixth transistor TR6, and turning off the seventh and eighth transistors TR7 and TR8. For example, when the signal SIG is received, the second TX pull-up data TX_PUD2' and the second TX pull-down data TX_PDD2' may be fixed to a low level (e.g., GND).

FIGS. 12A and 12B are tables for describing the first code CODE1 and the second code CODE2 according to example embodiments.

Referring to FIGS. 3 and 12A, in an embodiments, the equalizer 110 may perform the OCD operation instead of the EMP operation in the transmission operation. The equalizer 110 may operate as the OCD circuit instead of operating as the pre-emphasis circuit in the transmission operation. When the channel loss is little, the equalizer 110 at the transmission end may output the signal SIG by driving the signal line SL with the TX driver 120.

The calibration circuit 170 may transmit, to the EQ control circuit 130, a third EQ code EC3 corresponding to the OCD operation of the equalizer 110 and the second EQ code EC2 corresponding to the ODT operation of the equalizer 110.

The EQ control circuit 130 may receive the third EQ code EC3 and the second EQ code EC2 from the calibration circuit 170. The EQ control circuit 130 may select and output, as the first code CODE1, the third EQ code EC3 among the third EQ code EC3 and the second EQ code EC2 in response to the selection signal SEL indicating the transmission operation. Alternatively, the EQ control circuit 130 may select and output, as the first code CODE1, the second EQ code EC2 among the third EQ code EC3 and the second EQ code EC2 in response to the selection signal SEL indicating the reception operation. The detailed descriptions of the second code CODE2 are the same as those given with reference to FIG. 5, and thus are omitted.

Referring to FIGS. 1, 3, and 12B, in an embodiments, the integrated circuit devices 11 and 12 may generate the selection signal SEL indicating a first transmission operation TX1. The selection signal SEL indicating the first transmission operation TX1 may have the first value (for example, '0'). The integrated circuit devices 11 and 12 may generate the selection signal SEL indicating a second transmission operation TX2. The selection signal SEL indicating the second transmission operation TX2 may have the second value (for example, '1'). The integrated circuit devices 11 and 12 may generate the selection signal SEL indicating a reception operation RX. The selection signal SEL indicating the reception operation RX may have a third value (for example, '2').

For example, the first transmission operation TX1 may be referred to as an operation, in which the equalizer 110 performs the EMP operation and outputs a signal, due to the channel loss. Because the channel loss in the second transmission operation TX2 is little, the equalizer 110 may perform the OCD operation instead of the EMP operation, and indicate an operation of outputting a signal. The reception operation RX may be referred to an operation of receiving a signal.

In an embodiment, the equalizer 110 may perform the OCD operation instead of the EMP operation in the transmission operation. The equalizer 110 may operate as the pre-emphasis circuit or as the OCD circuit in the transmission operation. When the channel loss is great, the equalizer 110 at the transmission end may amplify high frequency components of the signal SIG. When the channel loss is little, the equalizer 110 at the transmission end may output the signal SIG by driving the signal line SL with the TX driver 120.

The calibration circuit 170 may transmit, to the EQ control circuit 130, the first EQ code EC1 corresponding to the EMP operation of the equalizer 110, the second EQ code EC2 corresponding to the ODT operation of the equalizer 110, and the third EQ code EC3 corresponding to the OCD operation.

The EQ control circuit 130 may receive the first EQ code EC1 through third EQ code EC3 from the calibration circuit 170. The EQ control circuit 130 may select and output the first EQ code EC1 among the first through third EQ codes EC1 through EC3 as the first code CODE1, in response to the selection signal SEL indicating the first transmission operation TX1. The EQ control circuit 130 may select and output the third EQ code EC3 among the first through third EQ codes EC1 through EC3 as the first code CODE1, in response to the selection signal SEL indicating the second transmission operation TX2. The EQ control circuit 130 may select and output the second EQ code EC2 among the first through third EQ codes EC1 through EC3 as the first code CODE1, in response to the selection signal SEL indicating the reception operation RX.

The TX control circuit 140 may receive the first TX code TC1 and the second TX code TC2 from the calibration circuit 170. The TX control circuit 140 may select and output the first TX code TC1 among the first TX code TC1 and the second TX code TC2 as the second code CODE2, in response to the selection signal SEL indicating the first transmission operation TX1 or the second transmission operation TX2. The TX control circuit 140 may select and output, as the second code CODE2, the second TX code TC2 among the first TX code TC1 and the second TX code TC2, in response to the selection signal SEL indicating the reception operation RX.

As described above, the EQ control circuit 130 may output the EQ control data EQCD indicating the EMP operation or the EQ control data EQCD indicating the OCD operation, in the transmission operation, and may output the EQ control data EQCD indicating the ODT operation, in the reception operation. The equalizer 110 may amplify the high frequency components of the signal SIG in response to the EQ control data EQCD indicating the EMP operation, or may drive the signal line SL to achieve impedance matching in response to the EQ control data EQCD indicating the OCD operation.

Figure 13:
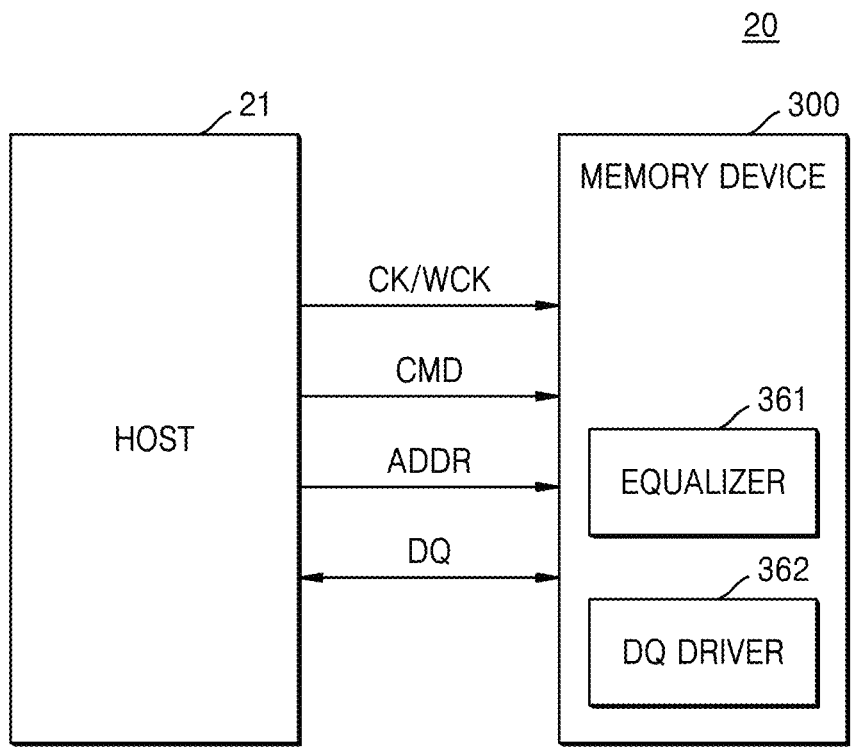
FIG. 13 is a block diagram illustrating a memory system according to an embodiment.

FIG. 13 is a block diagram illustrating a memory system 20 according to an embodiment.

Referring to FIG. 13, the memory system 20 may include a host 21 and a memory device 300. The host 21 and the memory device 300 may be the integrated circuit devices 11 and 12, respectively.

To store data in the memory device 300 or read data stored in the memory device 300, the host 21 may transmit, to the memory device 300, a system clock CK, a data clock WCK, a command CMD, and an address ADDR. The host 21 may transceive data to and from the memory device 300 via a plurality of data lines DQ (DQ1 through DQn), n is a natural number greater than 1. As an example, the host 21 may include a memory controller or a central processing unit (CPU).

As an example embodiment, the host 21 may communicate with the memory device 300 based on a high-speed interface such as a double data rate (DDR) interface. However, the embodiment is not limited thereto, and the host 21 may communicate with the memory device 300 based on at least one of various interfaces, such as universal serial bus (USB), a multimedia card (MMC), an embedded MMC (eMMC), peripheral component interconnection (PCI), PCI-express (PCI-E), advanced technology attachment (ATA), serial-ATA, parallel-ATA, a small computer small interface (SCSI), an enhanced small disk interface (ESDI), integrated drive electronics (IDE), Firewire, a universal flash storage (UFS), and non-volatile memory (NVM) express (NVMe).

The memory device 300 may store data received via the plurality of data lines DQ1 through DQn under the control of the host 21, or may transmit the stored data to the host 21 via the plurality of data lines DQ1 through DQn. Each of the plurality of data lines DQ1 through DQn may include the signal line SL in FIG. 1.

As an example embodiment, the memory device 300 may include dynamic random access memory (RAM) (DRAM). However, the scope of the inventive concept is not limited thereto, and the memory device 300 may include at least one of various memory devices, such as static RAM (SRAM), dynamic RAM (DRAM), synchronous DRAM (SDRAM), read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and ferro-electric RAM (FRAM).

The memory device 300 may include an equalizer 361 and a DQ driver 362. The DQ driver 362 may be configured to control each of the plurality of data lines DQ1 through DQn. For example, the DQ driver 362 may sense signals of the plurality of data lines DQ1 through DQn and identify data provided by the host 21. In other words, the DQ driver 362 may operate as a receiver. In example embodiments, the DQ driver 362 may be at the reception end previously described above. By controlling a voltage of each of the plurality of data lines DQ1 through DQn, the DQ driver 362 may transmit data to the host 21. In other words, the DQ driver 362 may operate as a transmitter. In example embodiments, the DQ driver 362 may be at the transmission end previously described above.

In an embodiment, when the memory device 300 performs a read operation in response to a read command, the memory device 300 may perform a transmission operation outputting data to the host 21. When the memory device 300 performs a write operation in response to a write command, the memory device 300 may perform a reception operation receiving data from the host 21.

The equalizer 361 may be the equalizer 110 in FIG. 3. The equalizer 361 may perform the EMP operation, the OCD operation, and the ODT operation described with reference to FIGS. 1, 2A, 2B, 3 through 11, 12A, and 12B. The DQ driver 362 may be the TX driver 120 in FIG. 3. The DQ driver 362 may perform the OCD operation and the ODT operation described with reference to FIGS. 1, 2A, 2B, 3 through 11, 12A, and 12B. The memory device 300 may further include the serializer 150, the delay circuit 160, the calibration circuit 170, the EQ control circuit 130, the TX control circuit 140, or the like in FIG. 3.

The equalizer 361 may operate as the ODT circuit at the reception end. In this manner, the ODT range of the memory device 300 may be increased. Accordingly, the memory device 300, in which an area of a chip forming the memory device 300 is reduced and parasitic capacitance is reduced, may be provided.

Figure 14:
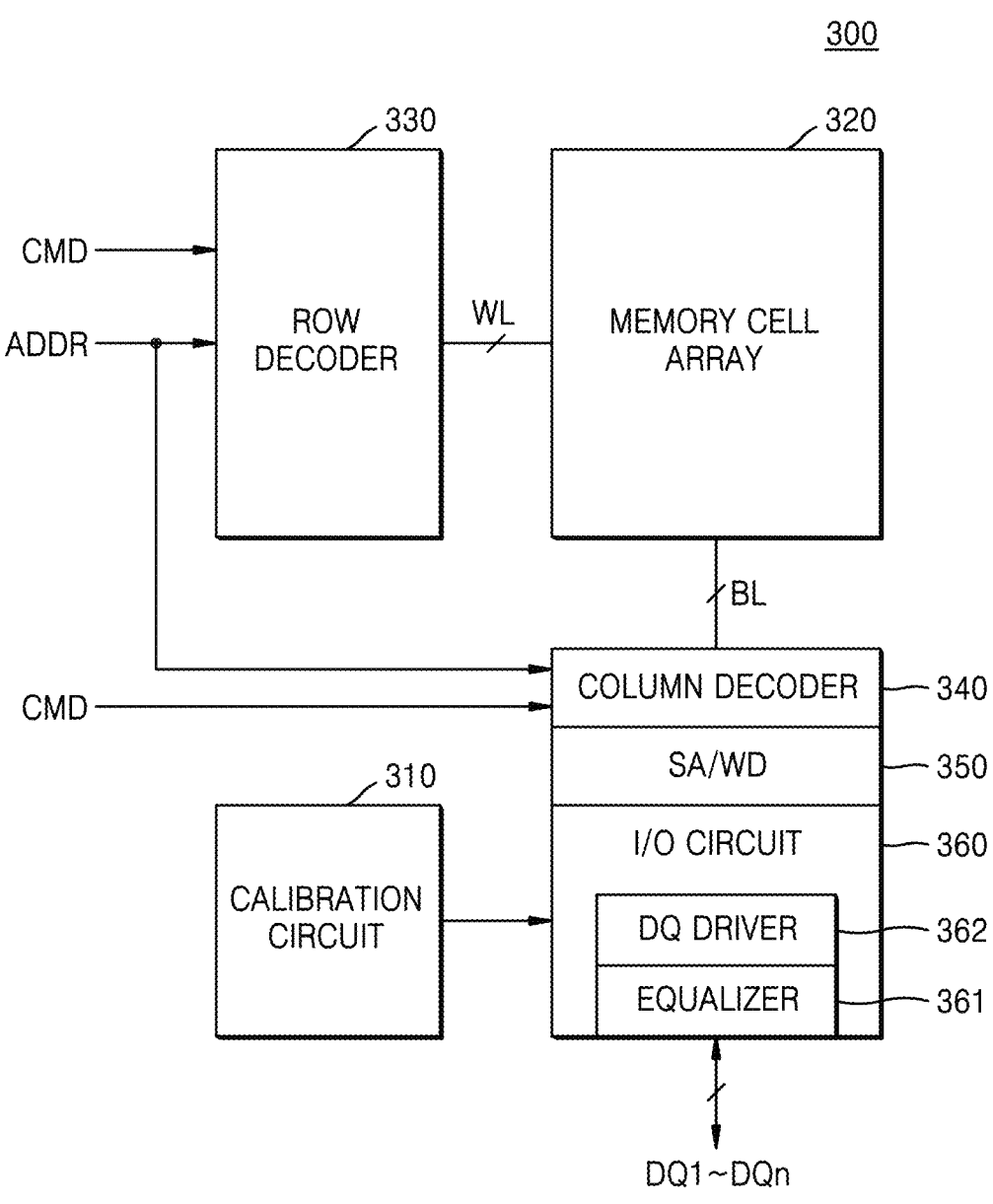
FIG. 14 is a block diagram illustrating a memory device according to an embodiment.

FIG. 14 is a block diagram illustrating the memory device 300 according to an embodiment.

Referring to FIGS. 13 and 14, the memory device 300 may include a calibration circuit 310, a memory cell array 320, a row decoder 330, a column decoder 340, a sense amplifier/write driver (SA/WD) 350, and an input/output (I/O) circuit 360. The calibration circuit 310 may be the calibration circuit 170 in FIG. 3. The calibration circuit 310 may perform the calibration operation described with reference to FIGS. 1, 2A, 2B, 3 through 11, 12A, and 12B.

The memory cell array 320 may include a plurality of memory cells. Each of the plurality of memory cells may be respectively connected to a word line WL and a bit line BL. Each of the plurality of memory cells may be configured to store data according to a control of the word line WL and the bit line BL. Each of the plurality of memory cells may include a storage capacitor and a DRAM cell including a transmission transistor.

The row decoder 330 may be connected to the memory cell array 320 via a plurality of word lines WL. The row decoder 330 may control voltages of the word lines WL in response to the address ADDR and the command CMD. In an embodiment, the address ADDR may include a row address, and the command CMD may include a row address strobe (RAS) signal.

The column decoder 340 may be connected to the memory cell array 320 via a plurality of bit lines BL. The column decoder 340 may receive the address ADDR and the command CMD, and may select at least one bit line BL among the bit lines BL in response to a received signal. In an embodiment, the address ADDR may include a column address, and the command CMD may include a column address strobe (CAS) signal. The SA/WD 350 may sense or control a voltage of a bit line BL selected by the column decoder 340.

The I/O circuit 360 may be connected to the plurality of data lines DQ1 through DQn, and may exchange data with an external device (for example, the host 21 in FIG. 13) via the plurality of data lines DQ1 through DQn. In an embodiment, the I/O circuit 360 may include the equalizer 361 and the DQ driver 362.

An EQ control data (not illustrated) may be generated and output to the equalizer 361 so that the equalizer 361 may perform a pre-emphasis operation during the data transmission operation, and may be generated and output to the equalizer 361 so that the equalizer 361 may perform the ODT operation during the data reception operation.

The equalizer 361 may amplify high-frequency components during the data transmission operation based on the EQ control data EQCD, and provide the termination resistance during the data reception operation.

The DQ driver 362 may transmit data to the host 21 via the plurality of data lines DQ1 through DQn during the data transmission operation, and provide the termination resistance during the data reception operation.

Figure 15:
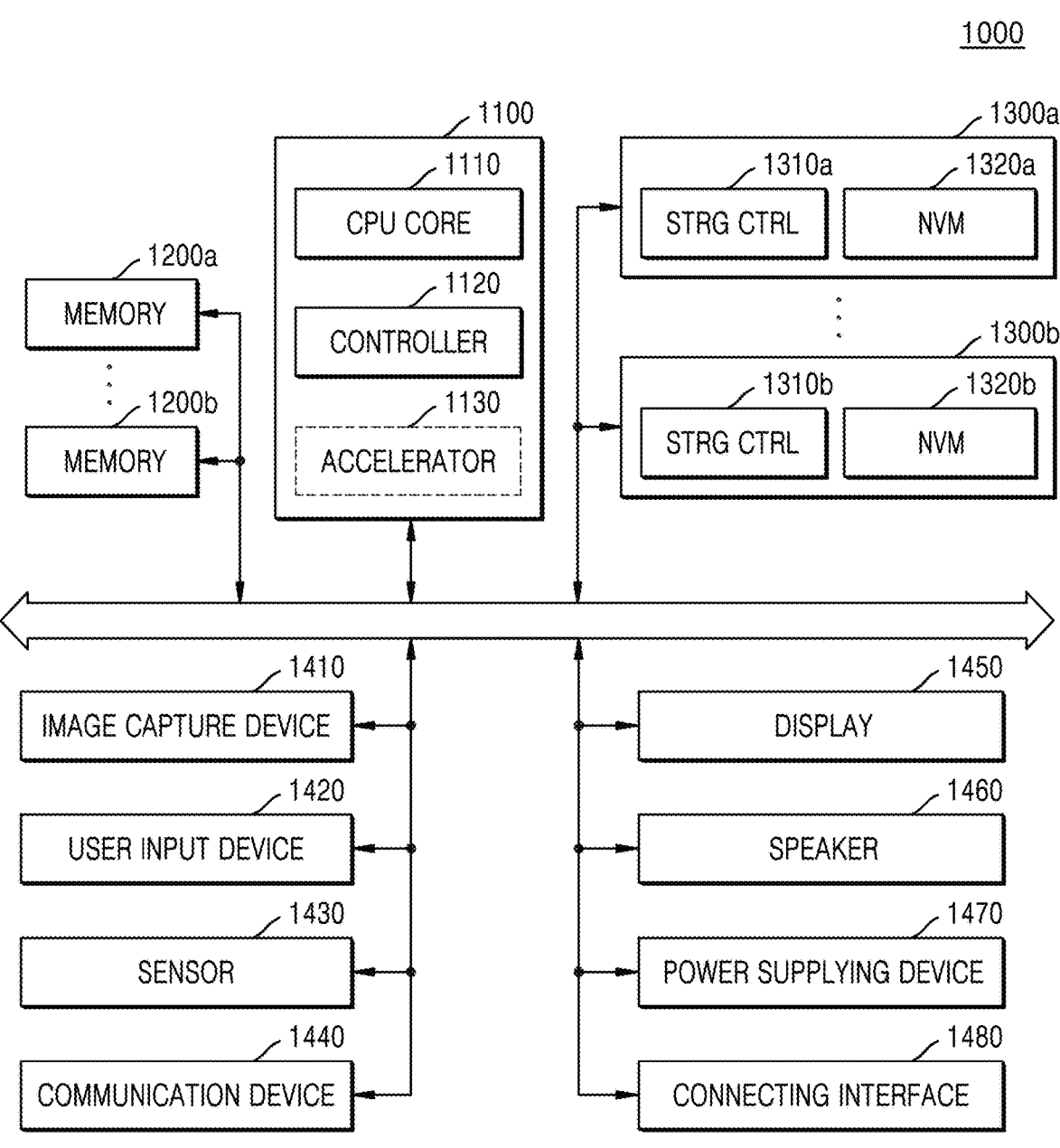
FIG. 15 is a diagram illustrating a system, to which memory devices are applied, according to an embodiment.

FIG. 15 is a diagram illustrating a system 1000, to which memory devices are applied, according to an embodiment.

The system 1000 of FIG. 15 may basically include a mobile system such as a mobile phone, a smartphone, a tablet personal computer (PC), a wearable device, a health care device, or an Internet of Things (IoT) device. However, the system 1000 of FIG. 15 is not necessarily limited to the mobile system, and may also include a PC, a laptop computer, a server, a media player, or an automotive device such as a navigation device.

Referring to FIG. 15, the system 1000 may include a main processor 1100, memories 1200a and 1200b, and storage devices 1300a and 1300b, and in addition, may include one or more of an image capturing device 1410, a user input device 1420, a sensor 1430, a communication device 1440, a display 1450, a speaker 1460, a power supplying device 1470, and a connecting interface 1480.

The main processor 1100 may control an overall operation of the system 1000, and more particularly, may control operations of other components constituting the system 1000. The main processor 1100 may be implemented as a general purpose processor, a dedicated processor, an application processor, etc.

The main processor 1100 may include one or more CPU cores 1110, and may further include a controller 1120 for controlling the memories 1200a and 1200b and/or the storage devices 1300a and 1300b. According to an embodiment, the main processor 1100 may further include an accelerator 1130, which is a dedicated circuit for a high speed data computation such as an artificial intelligence (AI) data computation. The accelerator 1130 may include a graphics processing unit (GPU), a neural processing unit (NPU), and/or a data processing unit (DPU), or the like, and may be implemented as a separate chip, which is physically independent of other components of the main processor 1100.

The memories 1200a and 1200b may be used as a main memory device of the system 1000, and may include a volatile memory such as SRAM and/or DRAM, but may also include an NVM such as a flash memory, PRAM, and/or RRAM. The memories 1200a and 1200b may be implemented in the same package as the main processor 1100.

The storage devices 1300a and 1300b may store data as a non-volatile storage device regardless of a power supply, and may have a relatively larger storage capacity than the memories 1200a and 1200b. The storage devices 1300a and 1300b may include storage controllers 1310a and 1310b, and non-volatile memories NVM 1320a and 1320b storing data under the control of the storage controllers 1310a and 1310b. The NVMs 1320a and 1320b may include a V-NAND flash memory having a 2-dimensional (2D) or a 3-dimensional (3D) vertical NAND structure, but may also include NVMs of different types, such as PRAM and/or RRAM.

The storage devices 1300a and 1300b may also be included in the system 1000 in a state of physical separation from the main processor 1100, and may also be implemented in the same package as the main processor 1100. In addition, the storage devices 1300a and 1300b may have the same shape as a shape of a solid state drive (SSD) or a memory card, and thus, may be also detachably combined with other components of the system 1000 via an interface such as the connecting interface 1480 to be described below. The storage devices 1300a and 1300b may include a device to which standard convention, such as a universal flash storage (UFS), an embedded multimedia card (eMMC), and NVM express (NVMe) is applied, but are not necessarily limited thereto.

The image capturing device 1410 may capture static image or video image, and may include a camera, a camcorder, and/or a webcam, etc.

The user input device 1420 may receive various types of data input by a user of the system 1000, and may include a touch pad, a keypad, a keyboard, a mouse, and/or a microphone, etc.

The sensor 1430 may sense various types of physical amount obtainable from the outside of the system 1000, and may convert the sensed physical amount into an electrical signal. The sensor 1430 may include a temperature sensor, a pressure sensor, an illuminance sensor, a location sensor, an acceleration sensor, a biosensor, and/or a gyroscope, etc.

The communication device 1440 may perform transceiving of a signal between other devices outside the system 1000 according to various communication conventions. The communication device 1440 may be implemented by including an antenna, a transceiver, and/or a MODEM, etc.

The display 1450 and the speaker 1460 may respectively function as output devices for outputting visual information and audio information to a user of the system 1000.

The power supplying device 1470 may properly convert power supplied by a battery (not illustrated) embedded in the system 1000 and/or an external power source, and provide the converted power to each component of the system 1000.

The connecting interface 1480 may provide a connection between the system 1000 and an external device, which is connected to the system 1000 and exchanges data with the system 1000. The connecting interface 1480 may be implemented by using various interface methods, such as ATA, SATA, external SATA (e-SATA), SCSI, serial attached SCSI (SAS), PCI, PCIe, NVMe, IEEE 1394, universal serial bus (USB), a secure digital (SD) card, a multi-media card (MMC), an embedded MMC (eMMC), UFS, embedded UFS (eUFS), and a compact flash (CF) card interface.

In an embodiment, the various memory devices included in the system 1000 (for example, 1200a, 1200b, or the like) may include the integrated circuit devices 11 and 12 described with reference to FIGS. 1, 2A, 2B, 3 through 11, 12A, and 12B. The storage devices 1300a and 1300b included in the system 1000 may include the integrated circuit devices 11 and 12 described with reference to FIGS. 1, 2A, 2B, 3 through 11, 12A, and 12B. An equalizer included in the memory devices (for example, 1200a and 1200b) and the storage devices 1300a and 1300b may operate as the ODT circuit during the reception operation, and provide the termination resistance. Accordingly, an integrated circuit device, in which an area of a chip forming one of the memories 1200a and 1200b is reduced and parasitic capacitance is reduced, may be provided. In addition, signal reflection to the signal line SL may be reduced, and the reliability of the signal SIG may be improved.

While the present invention has been particularly shown and described with reference to embodiments thereof, it will be understood that various changes in form and details may be made therein without departing from the spirit and scope of the following claims.

What is claimed is:

1. An integrated circuit device comprising:

a transmission driver configured to, in response to a transmission control data, transmit an output signal to an outside through a signal line in a transmission operation, and provide a termination resistance in a reception operation that receives an input signal from the outside through the signal line; and an equalizer configured to, in response to an equalizer control data, amplify high-frequency components of the output signal in the transmission operation, and provide the termination resistance in the reception operation.

2. The integrated circuit device of claim 1, further comprising:

an equalizer control circuit configured to receive a second data and output, to the equalizer, the equalizer control data generated based on:

the second data, a first EQ code corresponding to a pre-emphasis operation in the transmission operation, and a second EQ code corresponding to an on die termination (ODT) operation in the reception operation.

3. The integrated circuit device of claim 2, further comprising:

a transmission control circuit configured to receive a first data and output, to the transmission driver, the transmission control data generated based on the first data, wherein the first data comprises:

a first TX code corresponding to an off chip driver (OCD) operation in the transmission operation, and a second TX code corresponding to the ODT operation in the reception operation.

4. The integrated circuit device of claim 3, further comprising:

a calibration circuit configured to:

perform a calibration operation, determine the first EQ code, the second EQ code, the first TX code, and the second TX code, provide the first EQ code and the second EQ code to the equalizer control circuit, and provide the first TX code and the second TX code to the transmission control circuit.

5. The integrated circuit device of claim 3, further comprising:

a serializer configured to receive an output data, and output the first data by serializing the output data, wherein the transmission control data includes a TX pull-up data and a TX pull-down data, wherein the transmission driver comprises a second pull-up driver and a second pull-down driver, wherein the second pull-up driver comprises:

a third resistor connected between the signal line and a third node; and a third transistor connected between the third node and a power supply voltage, and configured to operate in response to the TX pull-up data, and wherein the second pull-down driver comprises:

a fourth resistor connected between the signal line and a fourth node; and a fourth transistor connected between the fourth node and a ground voltage, and configured to operate in response to the TX pull-down data.

6. The integrated circuit device of claim 2, further comprising:

a serializer configured to receive an output data, and output a first data by serializing the output data; and a delay circuit configured to receive the first data, and output the second data by delaying the first data, wherein the equalizer control data includes an EQ pull-up data and an EQ pull-down data, wherein the equalizer comprises a first pull-up driver and a first pull-down driver, wherein the first pull-up driver comprises:

a first resistor connected between the signal line and a first node; and a first transistor connected between the first node and a power supply voltage, and configured to operate in response to the EQ pull-up data, and wherein the first pull-down driver comprises:

a second resistor connected between the signal line and a second node; and a second transistor connected between the second node and a ground voltage, and configured to operate in response to the EQ pull-down data.

7. The integrated circuit device of claim 1, further comprising:

an equalizer control circuit configured to receive a second data and provide the equalizer control data to the equalizer, wherein the equalizer control circuit comprises:

a multiplexer configured to receive a selection signal, a first EQ code, and a second EQ code, and output the first EQ code as a first code in response to the selection signal indicating the transmission operation and the second EQ code as the first code in response to the selection signal indicating the reception operation; and an encoder configured to output the equalizer control data by encoding the second data and the first code.

8. The integrated circuit device of claim 1, further comprising:

a transmission control circuit configured to receive a first data and provide the transmission control data to the transmission driver, wherein the transmission control circuit comprises:

a multiplexer configured to receive a selection signal, a first TX code, and a second TX code, and output:

the first TX code as a second code in response to the selection signal indicating the transmission operation, and the second TX code as the second code in response to the selection signal indicating the reception operation; and an encoder configured to output the transmission control data by encoding the first data and the second code.

9. The integrated circuit device of claim 1, further comprising:

a serializer configured to receive an output data, and output a first data by serializing the output data;

a delay circuit configured to receive the first data, and output a second data by delaying the first data; and an equalizer control circuit configured to receive the second data, a first EQ code, and a second EQ code, and provide, to the equalizer, the equalizer control data, wherein the equalizer control circuit comprises:

a multiplexer configured to receive a selection signal, the first EQ code, and the second EQ code, and output either the first EQ code corresponding to a pre-emphasis operation or the second EQ code corresponding to an on die termination (ODT) operation as a first code in response to the selection signal; and an encoder configured to output the equalizer control data by encoding the second data and the first code.

10. The integrated circuit device of claim 9, wherein the equalizer control data includes a first EQ pull-up data, a second EQ pull-up data, a first EQ pull-down data, and a second EQ pull-down data, wherein the equalizer comprises a first pull-up driver and a first pull-down driver, wherein the first pull-up driver comprises:

a first transistor connected between a power supply voltage and a first node, and configured to operate in response to the first EQ pull-up data;

a second transistor connected between the first node and a second node, and configured to operate in response to the second EQ pull-up data; and a first resistor connected between the second node and the signal line, and wherein the first pull-down driver comprises:

a second resistor connected between the signal line and a third node;

a third transistor connected between the third node and a fourth node, and configured to operate in response to the second EQ pull-down data; and a fourth transistor connected between the fourth node and a ground voltage, and configured to operate in response to the first EQ pull-down data.

11. The integrated circuit device of claim 1, further comprising:

a serializer configured to receive an output data, and output a first data by serializing the output data; and a transmission control circuit configured to receive the first data, a first TX code, and a second TX code, and provide, to the transmission driver, the transmission control data, wherein the transmission control circuit comprises:

a multiplexer configured to receive a selection signal, the first TX code, and the second TX code, and output either the first TX code corresponding to an off chip driver (OCD), or the second TX code corresponding to an on die termination (ODT) as a second code in response to the selection signal; and an encoder configured to output the transmission control data by encoding the first data and the second code.

12. The integrated circuit device of claim 11, wherein the transmission control data includes a first TX pull-up data, a second TX pull-up data, a first TX pull-down data, and a second TX pull-down data, wherein the transmission driver comprises a second pull-up driver and a second pull-down driver, wherein the second pull-up driver comprises:

a fifth transistor connected between a power supply voltage and a fifth node, and configured to operate in response to the first TX pull-up data;

a sixth transistor connected between the fifth node and a sixth node, and configured to operate in response to the second TX pull-up data; and a third resistor connected between the sixth node and the signal line, and wherein the second pull-down driver comprises:

a fourth resistor connected between the signal line and a seventh node;

a seventh transistor connected between the seventh node and an eighth node, and configured to operate in response to the second TX pull-down data; and an eighth transistor connected between the eighth node and a ground voltage, and configured to operate in response to the first TX pull-down data.

13. The integrated circuit device of claim 1, wherein the equalizer is configured to activate in the reception operation.

14. The integrated circuit device of claim 1, wherein the transmission driver and the equalizer are connected to each other in parallel.

15. The integrated circuit device of claim 1, further comprising:

an equalizer control circuit configured to output the equalizer control data indicating:

a pre-emphasis operation or an off chip driver (OCD) operation in the transmission operation, and an on die termination (ODT) operation in the reception operation, wherein the equalizer is configured to:

amplify high frequency components of the output signal in response to the equalizer control data indicating the pre-emphasis operation, and drive the signal line to achieve impedance matching in response to the equalizer control data indicating the OCD operation.

16. An operation method of an integrated circuit device comprising an equalizer control circuit, a transmission driver, and an equalizer, the operating method comprising:

receiving, by the equalizer control circuit, a data and a selection signal indicating a reception operation of the integrated circuit device;

selecting, by the equalizer control circuit, as a first code, a second EQ code among a first EQ code corresponding to a pre-emphasis operation and the second EQ code corresponding to an on die termination (ODT) operation, in response to the selection signal indicating the reception operation;

generating an equalizer control data, by the equalizer control circuit, by encoding based on the first code and the received data;

outputting the generated equalizer control data to the equalizer; and providing termination resistance, by the equalizer, based on the equalizer control data.

* * * * *